United States Patent [19]
Watanabe

[11] Patent Number: 6,046,588
[45] Date of Patent: Apr. 4, 2000

[54] MAGNETIC RESONANCE APPARATUS

[75] Inventor: Hidehiro Watanabe, Yokohama, Japan

[73] Assignee: Technology Research Association of Medical and Welfare Apparatus, Tokyo, Japan

[21] Appl. No.: 08/970,627

[22] Filed: Nov. 14, 1997

[30] Foreign Application Priority Data

Nov. 15, 1996 [JP] Japan .................................. 8-304561

[51] Int. Cl.[7] ...................................................... G01V 3/00
[52] U.S. Cl. ........................................... 324/307; 324/309
[58] Field of Search ................................. 324/307, 309, 324/300, 311, 312, 314

[56] References Cited

U.S. PATENT DOCUMENTS

| | | | |
|---|---|---|---|
| 5,345,174 | 9/1994 | Kimmich et al. | 324/309 |
| 5,677,628 | 10/1997 | Watanabe et al. | 324/309 |
| 5,847,564 | 12/1998 | Smallcombe et al. | 324/307 |
| 5,894,221 | 4/1999 | Watanabe et al. | 324/307 |

OTHER PUBLICATIONS

Chemical Physics Letters, vol. 69, No.1,; pp. 185–189; Geoffrey Bodenhausen, et al.; Jan. 1, 1980.
Journal of the American Chemical Society, vol. 101, No.3; pp. 760–762; Gareth A. Morris, et al.; Jan. 31, 1979.
Journal of Magnetic Resonance, vol. 80; pp. 162–167; Lizann Bolinger, et al.; 1988.

*Primary Examiner*—Louis Arana
*Attorney, Agent, or Firm*—Oblon, Spivak, McClelland, Maier & Neustadt, P.C.

[57] ABSTRACT

First and second RF pulses are applied to a $^1$H and, simultaneously with or after the application of the second RF pulse, a third RF pulse is applied to the $^{13}$C magnetically coupled to the $^1$H, whereby there occurs a first polarization transfer from the spin of the $^1$H to the spin of the $^{13}$C. After the first polarization transfer, a fourth RF pulse is applied to the $^{13}$C. After the application of the fourth RF pulse, a fifth RF pulse is applied to the $^1$H together with a first slice gradient magnetic pulse. By doing so, those $^1$H spins in the first area are selectively excited, there occurs a second polarization transfer from the spin of the $^{13}$C to the spin of the $^1$H and those first MR signals are collected from those spins of the $^1$H in the first area experiencing the first and second polarization transfers. After the collection of a first MR signal, a sixth RF pulse is applied to the $^1$H together with a second slice gradient magnetic field pulse, whereby those $^1$H in a second area are selectively excited, there occurs a third polarization transfer from the spin of the $^{13}$C to the spin $^1$H and those second MR signals are collected from the spins of the $^1$H in the second areas experiencing the first and third polarization transfers.

33 Claims, 24 Drawing Sheets

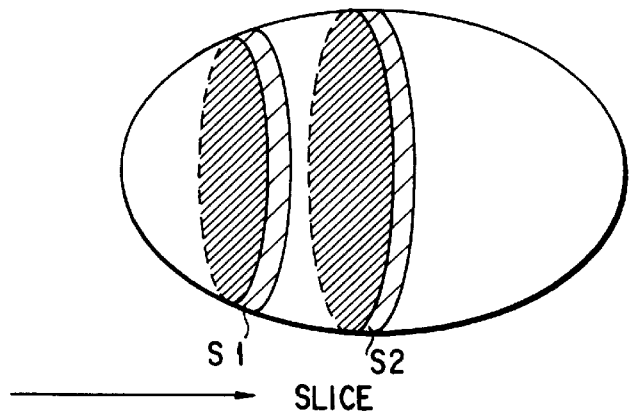
FIG. 7
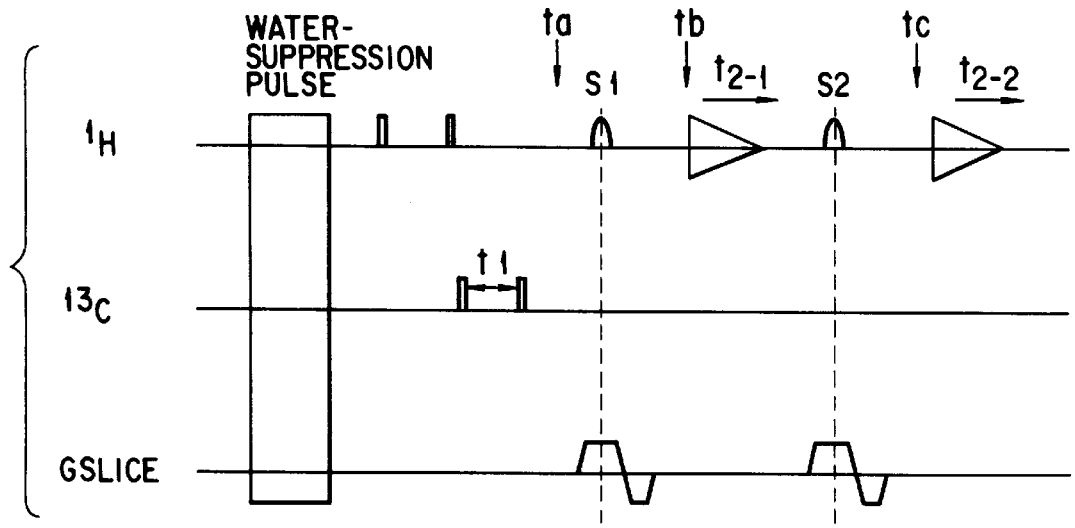
FIG. 8A
| | ta | tb | tc |
|---|---|---|---|
| SPIN STATE IN S1 | (2IzSz) LONGITUDINAL SPIN ORDER | (2IxSz) OBSERVABLE | DEPHASED NON-OBSERVABLE |
| SPIN STATE IN S2 | (2IzSz) LONGITUDINAL SPIN ORDER | (2IzSz) NON-OBSERVABLE | (2IxSz) OBSERVABLE |
FIG. 8B

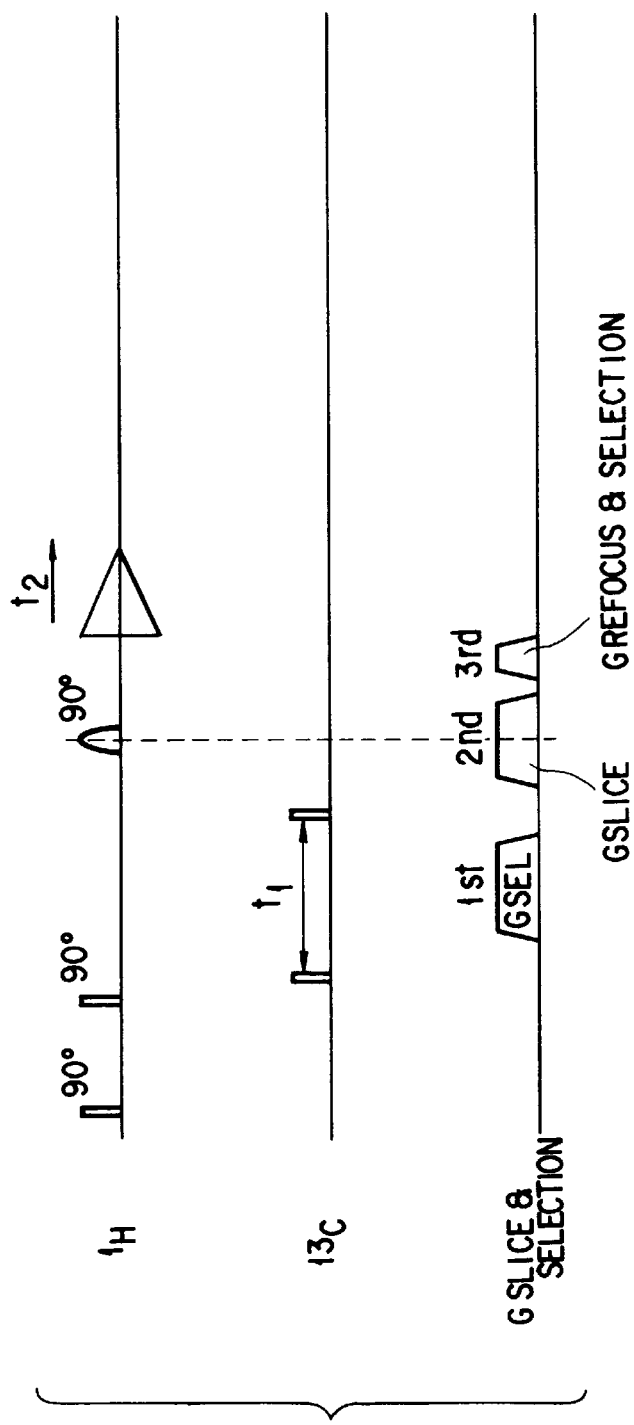
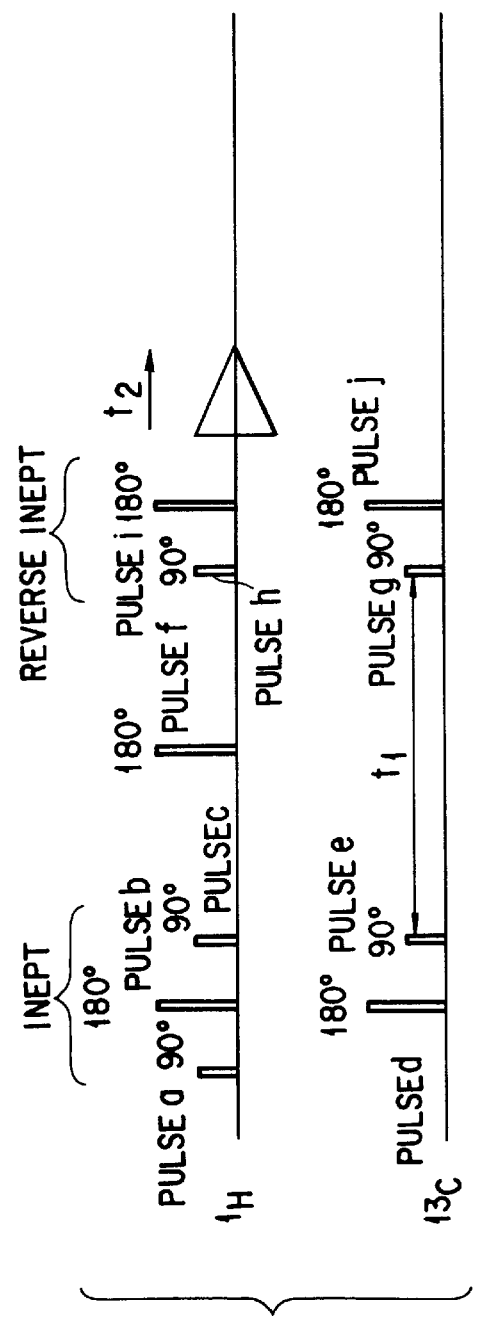
FIG. 10
FIG. 11

MAGNETIC RESONANCE APPARATUS

BACKGROUND OF THE INVENTION

The present invention relates to a magnetic resonance apparatus for detecting the chemical shift information of low-sensitive $^{13}C$ and $^{15}N$ from a high-sensitive $^{1}H$ with a high sensitivity level.

Many of an MRI (Magnetic Resonance Imaging) are the technique of non-invasively imaging the distribution of water in a living body by detecting the $^{1}H$ of the water molecule. The main information obtained with an image of a present-state water distribution is of a configuration type.

Attention has been recently paid to an MRS (Magnetic Resonance Spectroscopy) for obtaining the atomic nucleus information other than that of the $^{1}H$ of the water, so as to non-invasively obtain the metabolic information in the living tissue through the detection of, for example, a metabolic product, $^{1}H$, $^{13}C$ or $^{31}P$. Of these, particular attention has been recently focused on the $^{13}C$-MRS. Since the ratio of $^{13}C$ present in nature is as low as 1.1%, it is possible to highly accurately trace the manner of a metabolism after the dosing of a $^{13}C$ labeled substance and to obtain the metabolic information different from $^{1}H$ and $^{31}P$.

In the $^{13}C$-MRS, however, these has been the low S/N ratio problem. In order to overcome this problem, the $^{1}H$ detected method has been developed according to which it is possible to observe the $^{13}C$, with high sensitivity, from the $^{1}H$ which is magnetically coupled (J-coupled) to $^{13}C$. As one example, there is a pulse sequence of an HSQC in FIG. 1. This is a pulse sequence of applying first and second RF pulses to the $^{1}H$, then third and fourth RF pulses to the $^{13}C$ and then a fifth RF pulse to the $^{1}H$. From the first and second RF pulses to the $^{1}H$ and third RF pulse to the $^{13}C$ a polarization transfer (first polarization transfer) occurs from the $^{1}H$ to the $^{13}C$.

At a subsequent "evalution" time t1, the magnetization evolves with $^{13}C$ chemical shift and, by the fourth RF pulse to the $^{13}C$ and fifth RF pulse to the $^{1}H$, a polarization transfer (second polarization transfer) again occurs from the $^{13}C$ to the $^{1}H$. By doing so it is possible to observe the MR signal of the $^{1}H$ experiencing such polarization transfer on the $^{1}H$ side.

It is not until the $^{13}C$-MRS can provide the clinically useful information that such $^{13}C$-MRS can measure those spectra on a spatially adequately localized volume. Therefore, various methods are offered in this connection.

As representative examples, there are a method for applying, to the $^{13}C$-MRSI (Magnetic Resonance Spectroscopic Imaging) method for imparting a signal to the spatial information with the use of a phase encoding gradient magnetic field pulse, a method (J. Magn. Reson. Vol. 80, p.162 to p.167, 1998) of Lizann Bolinger, et al., applied to an ISIS (Image Selected In vivo Spectroscopy), and so on.

In the acquision of a signal from the N region for instance, it is necessary for these methods to run the pulse sequence N times. For the MRSI with the use of the encoding gradient field pulse for instance, it is necessary to obtain signals N times by varying the time integral of the intensity of the encoding gradient magnetic field pulses. Further, in order to obtain a spatial two-dimensional $^{13}C$ signal of a matrix size Nx×Ny, it is required that the scan be performed Nx×Ny times. That is, a longer scan time is required, thus posing the problem.

This problem provides an extra problem when the two-dimensional spectroscopy of the $^{1}H$ and $^{13}C$ is done with the HSQC for instance. With the number of steps in a frequency encoding direction done Nc times, it is necessary to obtain a signal Nx×Ny×Nc times at a spatial two-dimension mapping. Let it be supposed that, for example, the repetition time TR is one second; the Nc, 128 and Ny, 8. Then it takes 136 minutes to effect checking once. For the $^{13}C$-MRS it is necessary to get the time variation of the spectrum after the dosing of the labeled reagent. In this case, it takes 136 minutes to make one checking and it is not possible at all to obtain a time variation involved.

For the MRI for imaging a spatial distribution of the $^{1}H$ in the water, such a longer scan time problem can be solved by a multi-slice imaging method.

FIG. 2 shows a pulse sequence when the multi-slice imaging method is applied to the spin echo method. In the imaging of slice regions SL1 and SL2 shown in FIG. 3, a spin echo is generated from those spins in the first slice area SL1 at a first excited pulse (90° pulse) and refocus pulse (180° pulse). Since, at this time, those spins outside the slice area SL1 are not excited, it is possible to create a spin echo from those spins in the slice area immediately after the data collection of the first slice area SL1 is completed. This method is of advantage in that the number of scans is not increased because data acquisition can be made from a plurality of areas in a one repetition time TR.

For the MRI, the multi-slice imaging method is very effective. It is difficult to apply this to the so-called the $^{1}H$ detected method for collecting the $^{13}C$ spectra with $^{1}H$ sensitivity as in the HSQC in FIG. 1.

FIG. 4 shows the case of applying the multi-slice method to the HSQC sequence. It is required, in this case, that all the RF pulses be made a slice select pulse $G_{slice}$. That is, first a signal of a slice region SL1 is observed and, in this case, a thermal equilibrium state prevails at other than the slice area SL1. Then another slice area SL2 is selected with the RF pulse and it is possible to observe a signal of a slice area SL2. By this method, signals from a plurality of regions can be collected by one scanning.

Since the spin repetitively experiences the slice select pulses, the incompleteness of the slice profile characteristic possessed by the slice select pulse produces an adverse cumulative effect. It is, therefore, unavoidable that there occurs an increase in signal loss.

Further, the $^{13}C$ RF pulse is used as a slice select excitation pulse but, since there is a broader resonance bandpath for the $^{13}C$ chemical shift, there occurs a temporal shift resulting from the pulse excitation, by the slice selection, over a broader range.

It has, therefore, been difficult to apply the conventional multi-slice method to the $^{13}C$-MRS.

BRIEF SUMMARY OF THE INVENTION

It is accordingly the object of the present invention to provide a magnetic resonance apparatus which, in an observation method for observing low-sensitive nuclide information from a plurality of areas from a high-sensitive nuclide, can reduce a scan time, suppress a signal loss and eliminate a spatial displacement.

The present invention is achieved by paying attention to the fact that, in a sequence for observing a low-sensitive second nuclide information from a high-sensitive first nuclide with a high sensitivity level, the spin of the first nuclide is brought to a longitudinally magnetized state immediately before, a fifth RF pulse. First, when the fifth RF pulse is applied, as a slice selective RF pulse, together with a gradient magnetic field pulse, the spins of a first nuclide in a first area is excited and a first MR signal is detected from the first area. The spins of the first nuclide outside the first area is not excited with the fifth RF pulse and is maintained in a longitudinally magnetized state. After the detection of the first MR signal, therefore, a second MR signal may be obtained from a second area by a sixth RF pulse (slice selective RF pulse). The number of areas from which a corresponding signal is detected can be increased so long as the longitudinal relaxation time is allowed. By one scanning, MR signals are sequentially detected from a plurality of areas, so that the reduction of the scan time can be realized. Further, the number of pulses applied is reduced and it is possible to alleviate the cumulative loss of signals resulting from the incompleteness of the slice profile characteristic. Further, slice selection is not applied to a second nuclide where a resonance bandpath is generally broad, so that special displacement may be alleviated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 7 is a view showing a plurality of (two) areas for which signals are observed in a pulse sequence in FIG. 6;

FIG. 8A is a view showing times ta, tb, tc in the pulse sequence of FIG. 6;

FIG. 8B shows those $^1H$ spin states in two areas at times ta, tb, tc in FIG. 8A;

FIG. 10 is a view showing the pulse sequence of FIG. 9 in the case of effecting coherence selection and slice selection;

FIG. 11 is a view showing a basic HSQC sequence using added refocusing RF pulse and inversion RF pulse;

DETAILED DESCRIPTION OF THE INVENTION

An embodiment of the present invention will be explained below with reference to the accompanying drawing. Hereinbelow, explanation will be given below about the case where $^1H$ denotes a high-sensitive nuclide and $^{13}C$ a low-sensitive nuclide. It may be, of course, possible to use other combinations, such as a combination of $^1H$ and $^{15}N$.

Figure 5:
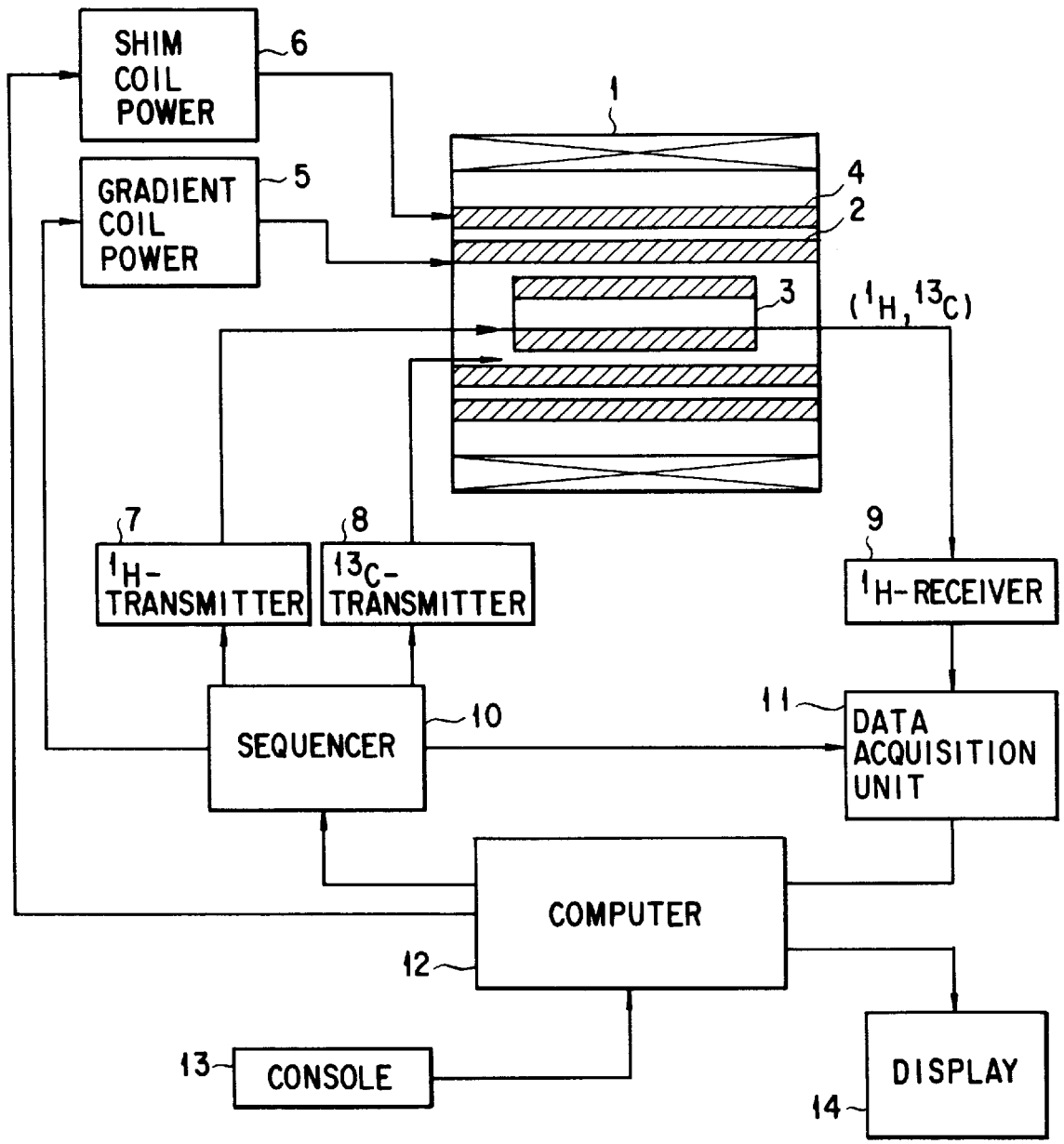
FIG. 5 is a schematic diagram showing a magnetic resonance apparatus according to a preferred embodiment of the present invention.

FIG. 5 is a block diagram showing an arrangement of a magnetic resonance apparatus. In FIG. 5, a homogeneous static magnetic field and gradient magnetic field having a linear gradient magnetic field distribution in a mutually diagonally three directions x, y, z, are applied to a subject, not shown, by a static magnetic field magnet 1 as well as a gradient coil 2 and shim coil 4 in the static magnetic field magnet 1. The gradient coil 2 is driven by a gradient coil power supply 5 and the shim coil 4 is driven by a shim coil power supply 6. A probe 3 provided inside the gradient coil 2 comprises a high frequency coil and an associated element necessary for the resonance frequency of the high frequency coil to be tuned and is adapted to gain a tuning with a resonance frequency between $^1$H and $^{13}$C.

In order to generate a frequency RF pulse corresponding to a resonance frequency of the $^1$H from the probe 3, a $^1$H transmitter 7 supplies a high frequency current pulse of that frequency to the probe 3. Similarly, in order to generate a frequency RF pulse corresponding to a resonance frequency of $^{13}$C from the probe 3, a $^{13}$C from the probe 3, a $^{13}$C transmitter 8 supplies a high frequency current pulse of that frequency to the probe 3. A $^1$H receiver 9 receives, through the probe 3, an MR signal from those $^1$H spins in the subject to allow the signal to be amplified and detected. In this connection it is to be noted that the probe 3 may be equipped with a transmitting/receiving coil or separately with a transmitting-only or a receiving-only coil. A data acquisition unit 11 converts the MR signal which is received at the $^1$H receiver 9 to a digital signal and transfers it to a computer 12.

In order to perform various pulse sequences as will be set out below, a sequence 10 controls a gradient coil supply 5, $^1$H transmitter 7, $^{13}$C transmitter 8, $^1$H receiver 9 and data acquisition unit 11. Further, the sequencer 10 is controlled by the computer 12. The computer 12 is controlled by an instruction from a console 13.

The computer 12 subjects the MR signal from the data acquisition unit 11 to Fourier transformation and, based on a result of transformation, reconstructs the spectrum data of those desired nuclide spins in the subject or image data. The data is sent to a display 14 where it is displayed as a spectrum, an image, and etc.

Figure 1:
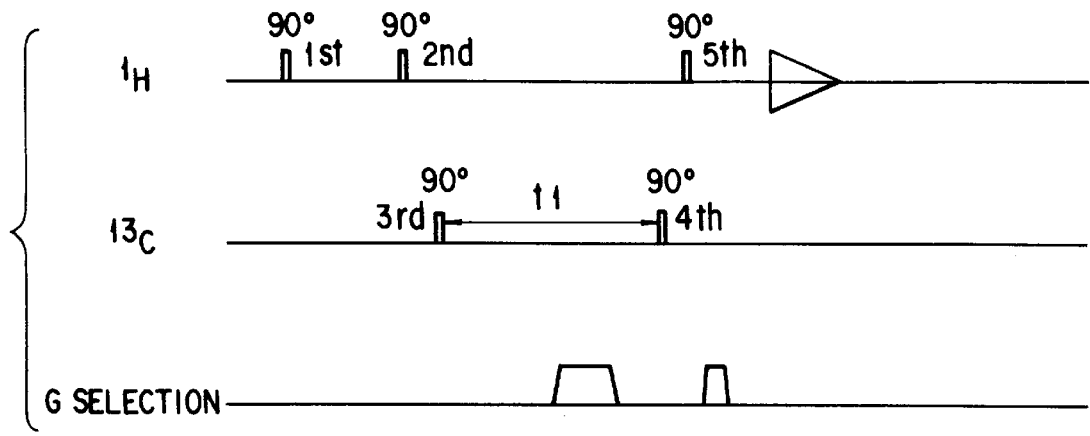
FIG. 1 is a view showing a pulse sequence of a conventional basic HSQC.
Figure 2:
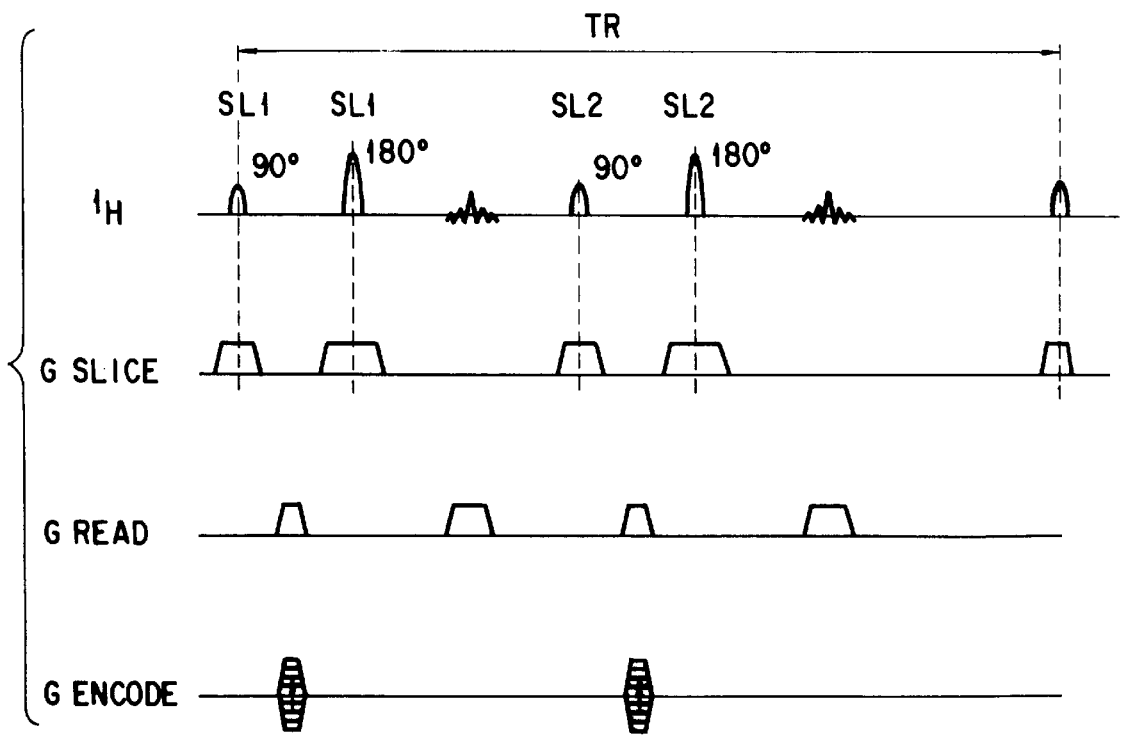
FIG. 2 is a view showing a pulse sequence of a multi-slice imaging method.
Figure 3:
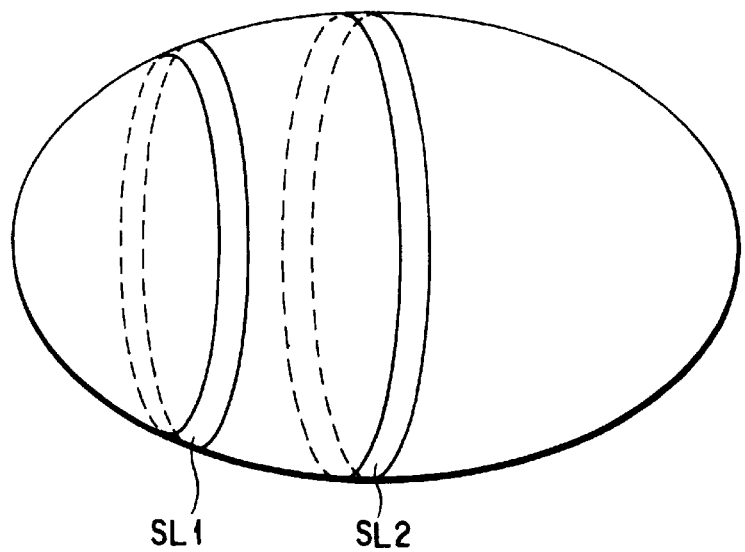
FIG. 3 is a model view showing two areas from which signals are detected.
Figure 4:
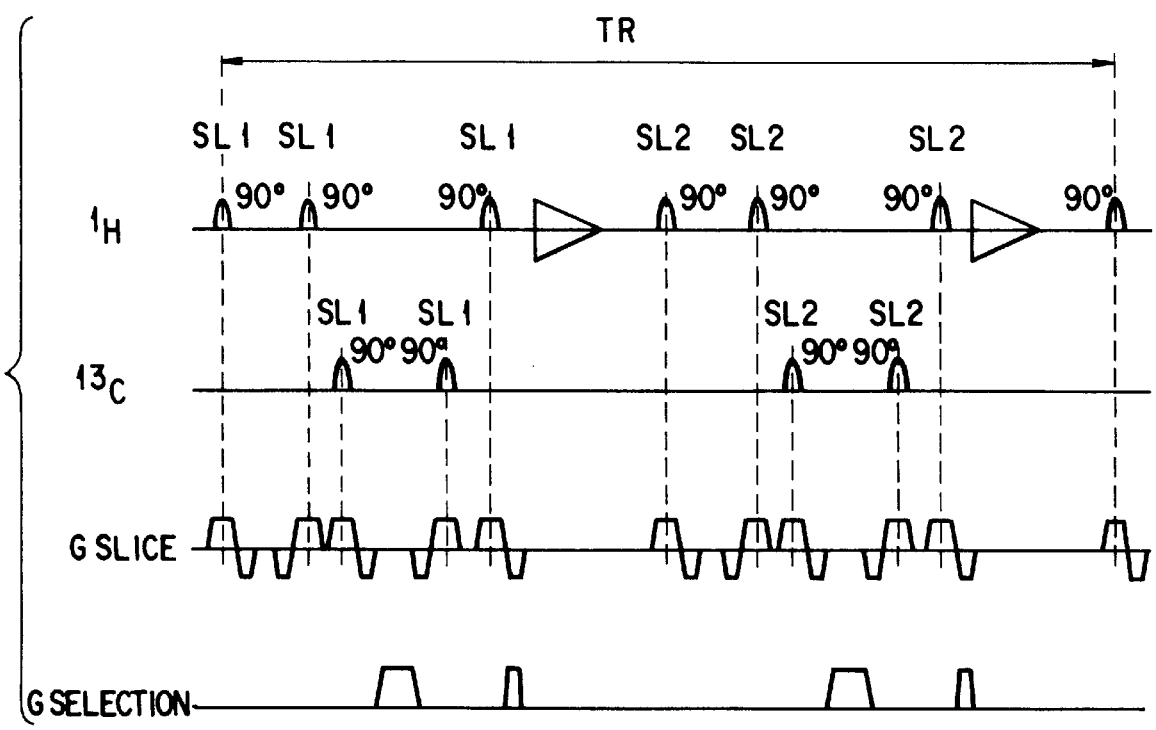
FIG. 4 is a view showing a conventional pulse sequence for allowing an observation of a plurality of areas to be made by applying a multi-slice imaging method to the HSQC.

Now explanation will be given below about a pulse sequence in the present embodiment. The basic HSQC pulse sequence is such that, as set out above in connection with FIG. 1, first and second RF pulses are sequentially applied to the $^1$H. Simultaneously with, or after the application of, the second RF pulse, a third RF pulse is applied to $^{13}$C. By doing so, there occurs a first polarization transfer from the spin of the $^1$H to the spin of the $^{13}$C and a single quantum coherence involving $^{13}$C-spin magnetization is created. In the following time period ti from the third RF pulse to a fourth pulse, the magnetization evolves with the $^{13}$C chemical shift.

At the occurrence of a fifth 5RF pulse, a polarization transfer (second polarization transfer) again arises to produce a transverse magnetization and it is possible to detect, from the $^1$H, an MR signal with the chemical shift information of the $^{13}$C attached thereto.

Figure 6:
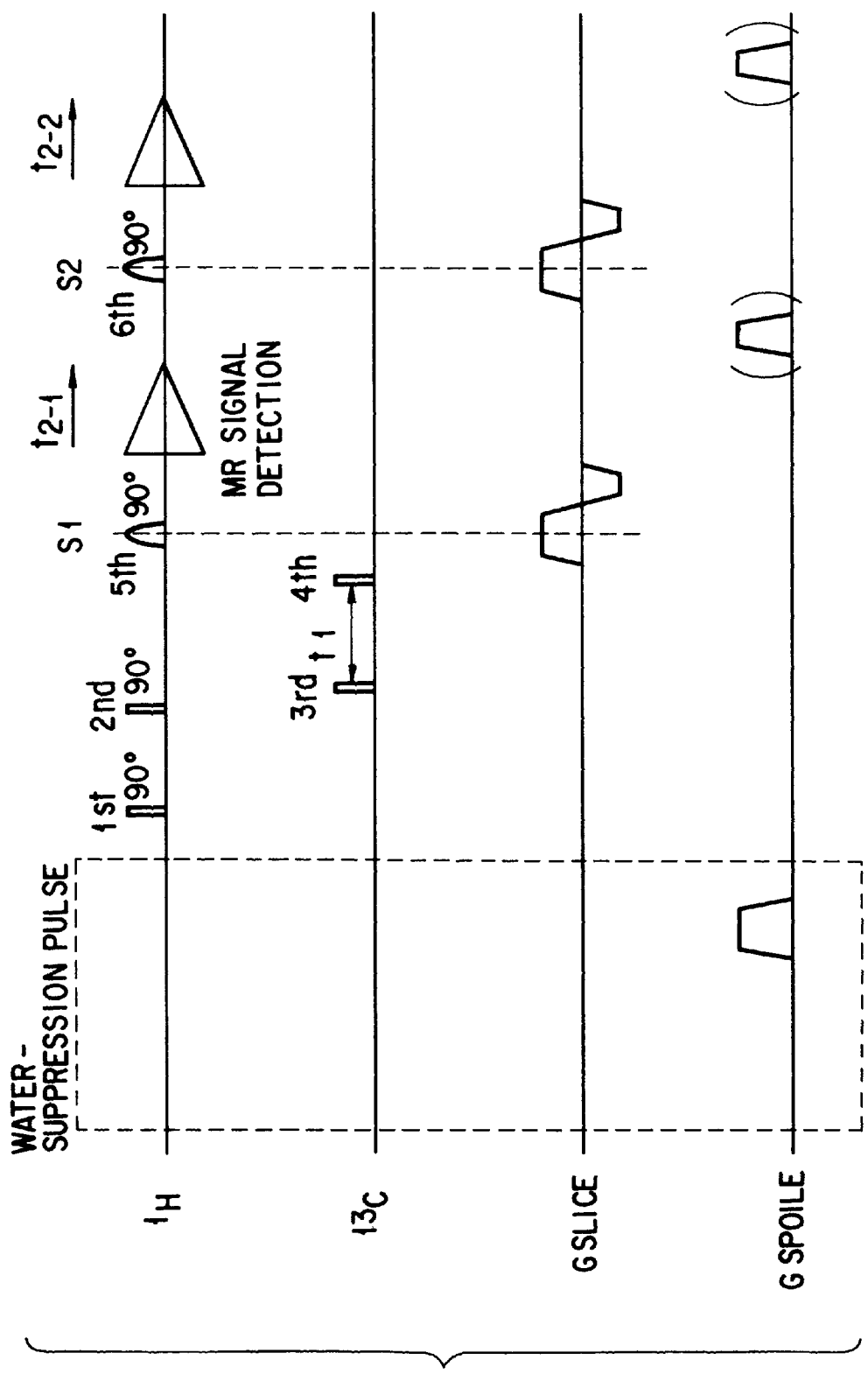
FIG. 6 is a view showing a pulse sequence of the present embodiment.

FIG. 6 shows a pulse sequence, improved over the HSQC pulse sequence, in which signals can be observed from a plurality of slab areas (see FIG. 7) localized with respect to one axis. Of importance is a state (a longitudinal spin order) in which magnetized spins are longitudinally magnetized immediately prior to the fifth RF pulse following the fourth RF pulse.

The fifth, sixth and more RF pulses, together with a gradient magnetic field pulse $G_{slice}$ for slice selection, are applied as slice select excitation pulses. By doing so, spins in respective areas of the subject are sequentially excited with the slice select excitation pulses and it is possible to observe these sequential signals from the corresponding areas.

An effect of the slice select excitation pulses is not exerted over those spins other than the spins of the selectively excited areas. It is, therefore, possible to set the spins other than those of the selectively excited areas in an "longitudinally-magnetized" state over a very long relaxation time. The relaxation time was found to be about 1.1 seconds upon measurement under a magnet of 2 teslas with the use of a C-2 labeled acetic acid. It is, therefore, possible to sequentially obtain MR signals from the respective areas while sequentially varying those excitation areas with the slice select excitation pulse. In this connection it is to be noted that the number of areas from which signals are obtained are 2 in FIG. 6. However, this number can be increased so long as the longitudinal relaxation time is allowed.

Although it is necessary to, upon measurement of $^1$H, suppress the signal from the $^1$H in the water, the water signals are suppressed by, in the case of FIG. 6, selectively exciting those spins of the $^1$H's in the water with a CHESS (chemical shift selective) pulse and adequately dephasing it with a gradient magnetic field pulse $G_{spoil}$. As the method for suppressing the $^1$H signal of the water, use may be made of other methods, such as the method for exciting other than the water, method for suppressing the coherence of the $^1$Hs in the water through the selection of coherence with the gradient magnetic field pulses, and so on.

FIG. 8B shows a spin state of $^1$H magnetically coupled to the $^{13}$C in the areas S1, S2 with consideration paid to only a dephased effect by the gradient magnetic field pulses, disregarding the dephasing by the selective excitation of the gradient magnetic field pulse and dephasing by the chemical shift of the $^1$H. As set out above, first and second RF pulses are applied to the $^1$H and then a third RF pulse is applied to the $^{13}$C. By doing so, there occurs a polarization transfer from the $^1$H to the $^{13}$C. Then a fourth RF pulse is applied to the $^{13}$C and, over a whole area of the subject, the spins are set in a longitudinally magnetized state 2IzSz which is longitudinal spin order state (a time ta in FIG. 8A).

Then a fifth RF pulse is applied to the $^1$H through the selective excitation of the area S1 and there arise those $^1$H spins alone in the area S1 in FIG. 7 and the spin is set in a 2IxSz state from which it is possible to observe the MR signal (a time tb in FIG. 8A). In an area other than the area S1, the spin at this time is maintained in a longitudinally, magnetized state 2IzSz. That is, in a time (t2−1), it is possible to observe a signal from the $^1$H coupled to the $^{13}$C in the area S1 alone.

Since the relaxation rate of the 2IzSz state is slow, it follows that, upon observation of a signal corresponding to the area S1, the polarized state (2IzSz state) is substantially maintained at those areas other than the S1 area. Then a sixth RF pulse is applied and, by doing so, the $^1$H spins in the area S2 are set in the 2IxSz state (a transverse magnetization) and it is possible to observe a signal from the $^1$H coupled to the $^{13}$C in the area S2 (a time tc in FIG. 8A). In this time, the 2IzSz in the earlier observed area S1 is dephased by the magnetic field inhomogeneity and gradient magnetic field pulse for S2 select excitation and it is possible to suppress the ratio in which a residual signal of an area S1 in a time period (t2−2) is mixed into a signal from the $^1$H in the area S2. That is, it is possible to, in the present pulse sequence, detect an MR signal from a plurality of areas by one scanning.

If the dephasing effect (signal attenuation) of 2IxIz in the area S1 is small and such a signal mixing problem is involved in the period (t2−1) and it is only necessary to, after the signal observation time (t2−1), apply a gradient magnetic field pulse Gspoil for dephasing.

Although FIG. 6 shows the case of observing signals from the two areas, signals can be observed by one scanning from more areas by increasing the RF pulses (slice selective excitation pulses) in the observation time t2.

In the prior art, it is necessary to effect scanning Nx×Ny times in the acquisition of information of a matrix size Nx×Ny. According to the method of the present embodiment, on the other hand, in the case of using an Nx number of selective excitation pulses in a time t2 in a slice direction x in FIG. 6, it is sufficient to effect scanning Ny times. That is, it is possible, according to the present invention, to set the scan time at 1/Nx times that of the conventional method.

This method is useful upon the making of two-dimensional correlation spectroscopy, particularly, in an $^1$H axis direction and $^{13}$C axis direction. This method requires a plurality of scannings by varying the length of an evaluation time t1. With the number of such scannings indicated by Nc, it is necessary, in the conventional method, to effect scannings Nc×Nx×Ny times. And the scan time of TR×Nx×Ny is required for the repetition time TR. That is, it takes a longer scan time at one point per spectrum time and, therefore, it is not possible to acquire a spectrum time change. According to the present invention, therefore, the scan time is set to be TR×Nx×Ny and it is adequately possible to set the scan time enough to be able to acquire a time variation.

Figure 9:
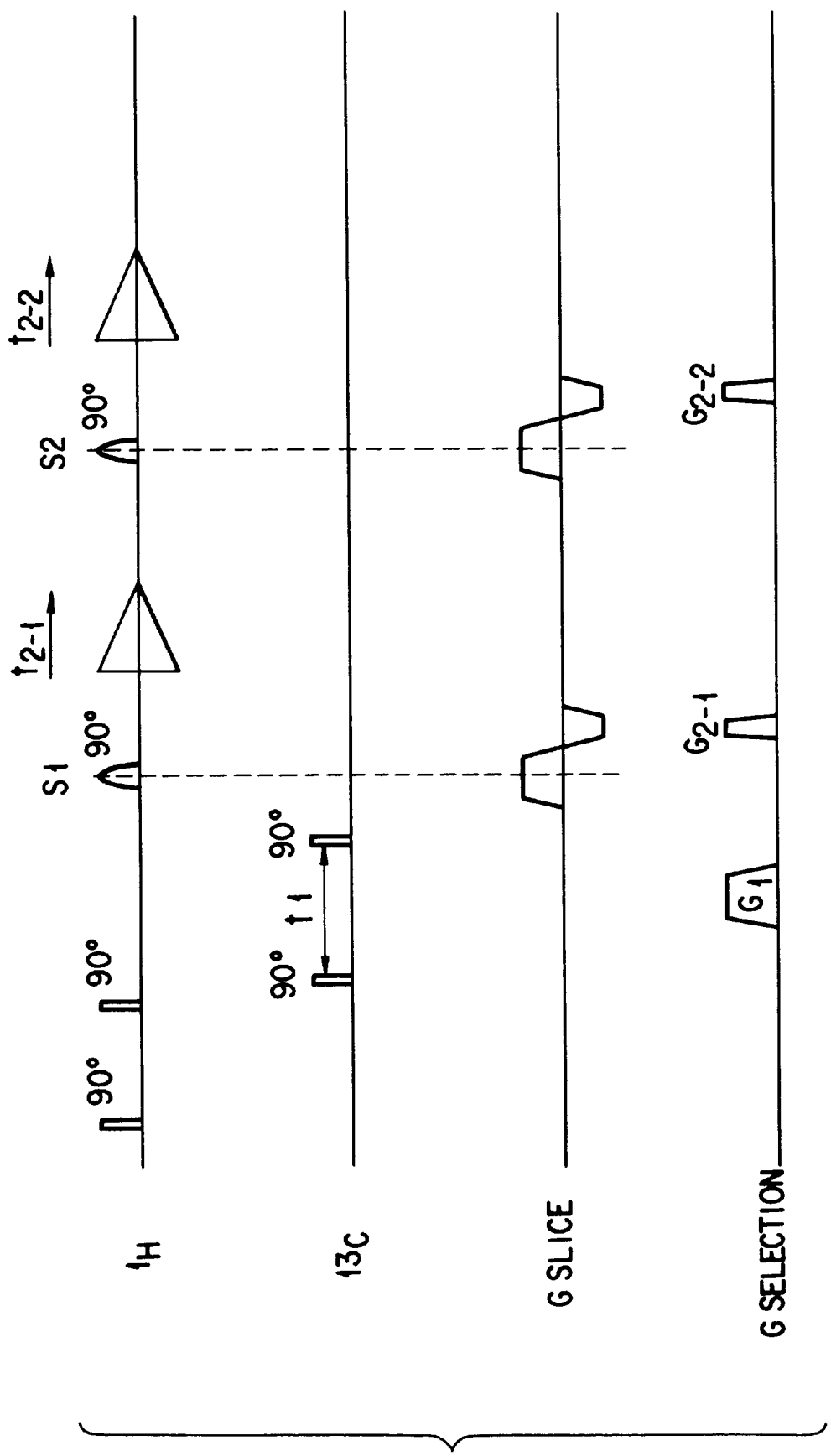
FIG. 9 is a view showing a pulse sequence of FIG. 6 using a method for water suppression by coherence selection using gradient pulses.

FIG. 9 shows a pulse sequence adopting a water suppressing method with the use of a coherence selection using the above-mentioned gradient magnetic field pulse (G. selection). In the pulse sequence, the coherence selection is such that the temporal integral of the gradient magnetic field pulse strength corresponds to single quantum coherence of the $^{13}$C in a time t1 or and to single quantum coherence of the $^1$H in the observation time (t2-1) at the area S1 and in the observation time (t2-2) at the area S2. For this reason, it is only necessary to satisfy either one of the following equations (1) and (2) and either one of the following equations (3) and (4).

$$\gamma_{13C} \cdot G1 + \gamma_{1H} \cdot G2 - 1 = 0 \quad (1)$$

$$\gamma_{13C} \cdot G1 - \gamma_{1H} \cdot G2 - 1 = 0 \quad (2)$$

$$\gamma_{13C} \cdot G1 + \gamma_{1H} \cdot G2 - 2 = 0 \quad (3)$$

$$\gamma_{13C} \cdot G1 - \gamma_{1H} \cdot G2 - 2 = 0 \quad (4),$$

provided that $\gamma_{13C}$, $\gamma_{1H}$ represent gyromagnetic ratios of $^{13}$C and $^1$H, respectively. Although, in the sequence in FIG. 9, the slice gradient magnetic field $G_{slice}$ and coherence selection gradient magnetic field $G_{selection}$ are separately applied, these may be applied as the gradient magnetic fields to the same axis. FIG. 10 shows a sequence in the case of applying such magnetic fields to the same axis. A first gradient magnetic field pulse is for coherence selection, a second gradient magnetic pulse is for selective excitation and a third gradient magnetic pulse is for bringing dephasing upon selective excitation back to refocusing and for coherence selection.

Heretofore, explanation has been made about the method for suppressing the water by a prepulse for the case of the suppression of a water signal as well as the method for suppressing the water by the coherence selection. Now explanation will be given below about a method for coherence selection by gradient magnetic field pulses.

FIG. 11 shows a pulse sequence using an HSQC (Heteronuclear Single Quantum Coherence) proposed by G. Bodenhausen. The HSQC comprises using an INEPT pulse set (J. American Chem. Soc. Vol $^1$01, p.760 to p.762, 1979) proposed by G. A. Morris, an inversion RF pulse to the $^1$H for J-expansion refocusing and a reverse INEPT pulse set. In the basic HSQC as shown in FIG. 6, the efficiency of the polarization transfer from the $^1$H to $^{13}$C is lowered through $^1$H chemical shift expansion and the S/N ratio is lowered through the axial direction splitting of the $^{13}$C by the J-expansion in an expansion time t1.

In order to handle this and prevent a lowering in the efficiency of polarization transfer from the $^1$H to the $^{13}$C by the expansion of the $^1$H chemical shift, an RF pulse (a pulse b in FIG. 11) for refocusing the $^1$H chemical shift is applied to a middle of an interval between a first RF pulse (a pulse a in FIG. 11) and a second RF pulse (a pulse c in FIG. 11) as shown in FIG. 11. Simultaneously with the RF pulse, an inversion RF pulse (a pulse d in FIG. 11) is applied to the $^{13}$C.

Further, in order to effect the J-expansion refocusing at the evalution time t1 in the HSQC in FIG. 11, an inversion RF pulse (a pulse f in FIG. 11) is applied to the $^1$H at a middle of an interval between a third RF pulse (a pulse e in FIG. 11) and a fourth RF pulse (a pulse g in FIG. 11). In this connection, a fifth RF pulse in FIG. 1 corresponds to a pulse h in FIG. 11.

In order to join the phases of those spectra split at a J-coupling in the axial direction of the $^1$H, an inversion RF pulse (a pulse i in FIG. 11) and inversion RF pulse (a pulse j in FIG. 11) are applied to the $^1$H and $^{13}$C, respectively, after the RF pulse h and RF pulse j. In this case, however, a pulse i and pulse j may not be applied.

Figure 12:
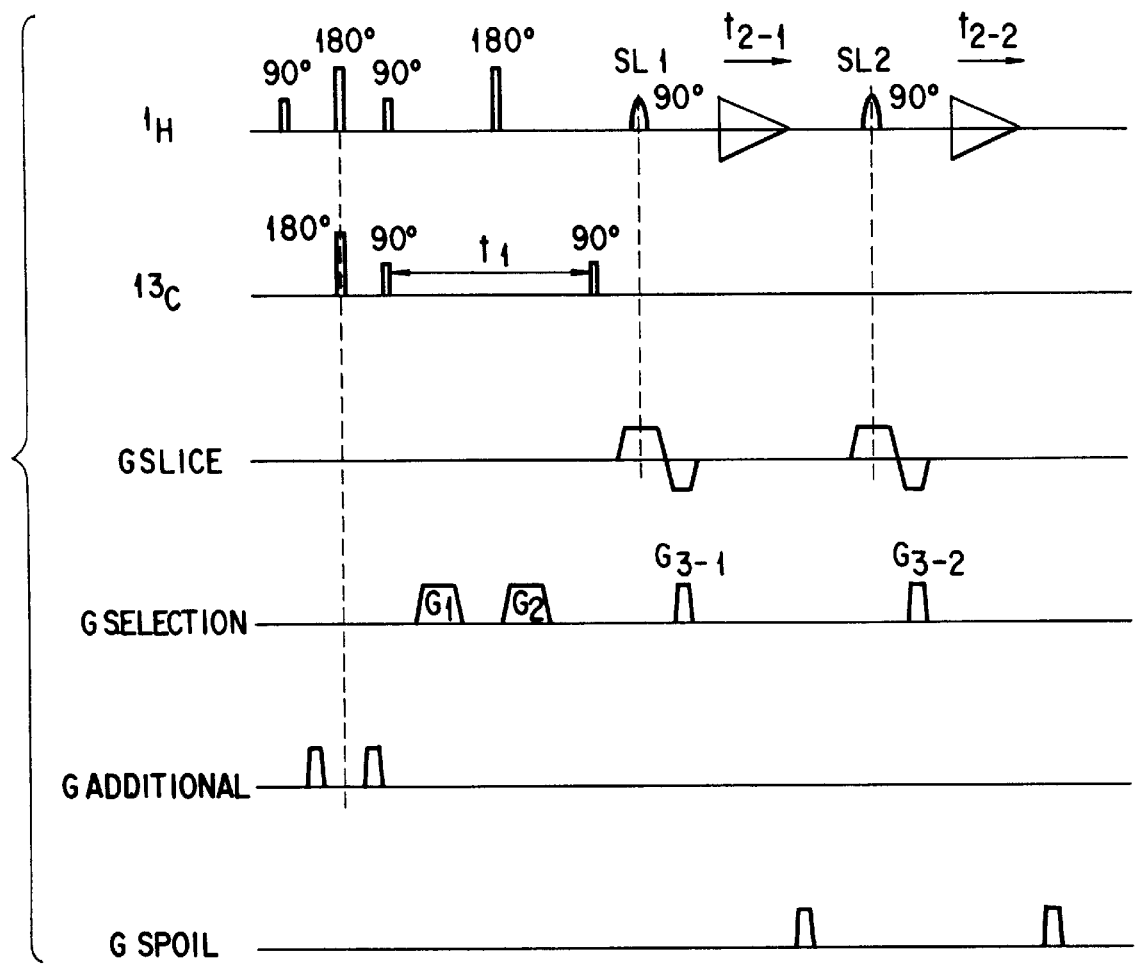
FIG. 12 is a view showing the HSQC sequence of FIG. 11 improved over the pulse sequence of FIG. 6.

FIG. 12 shows a case where the present embodiment is applied to the INEPT sequence. Through this sequence, the efficiency of the polarization transfer from the $^1$H to the $^{13}$C and of the polarization transfer from the $^{13}$C to the $^1$H is better and it is possible to collect $^{13}$C spectra from a plurality of areas with one scanning. A $G_{additional}$ is a gradient magnetic field pulse for removing unwanted signals caused by the incompleteness of a flip angle (180°) of the refocusing RF pulse to the $^1$H. The gradient magnetic field pulse for coherence selection for the water to be suppressed is so set for the temporal integral as to satisfy either one of the following equations (5) and (6) or either one of the following equations (7) and (8).

$$\gamma_{13C} \cdot G1 + \gamma_{13C} \cdot G2 + \gamma_{1H} \cdot G3 - 1 = 0 \quad (5)$$

$$\gamma_{13C} \cdot G1 + \gamma_{13C} \cdot G2 - \gamma_{1H} \cdot G3 - 1 = 0 \quad (6)$$

$$\gamma_{13C} \cdot G1 + \gamma_{13C} \cdot G2 + \gamma_{1H} \cdot G3 - 2 = 0 \quad (7)$$

$$\gamma_{13C} \cdot G1 + \gamma_{13C} \cdot G2 - \gamma_{1H} \cdot G3 - 2 = 0 \quad (8)$$

Figure 13:
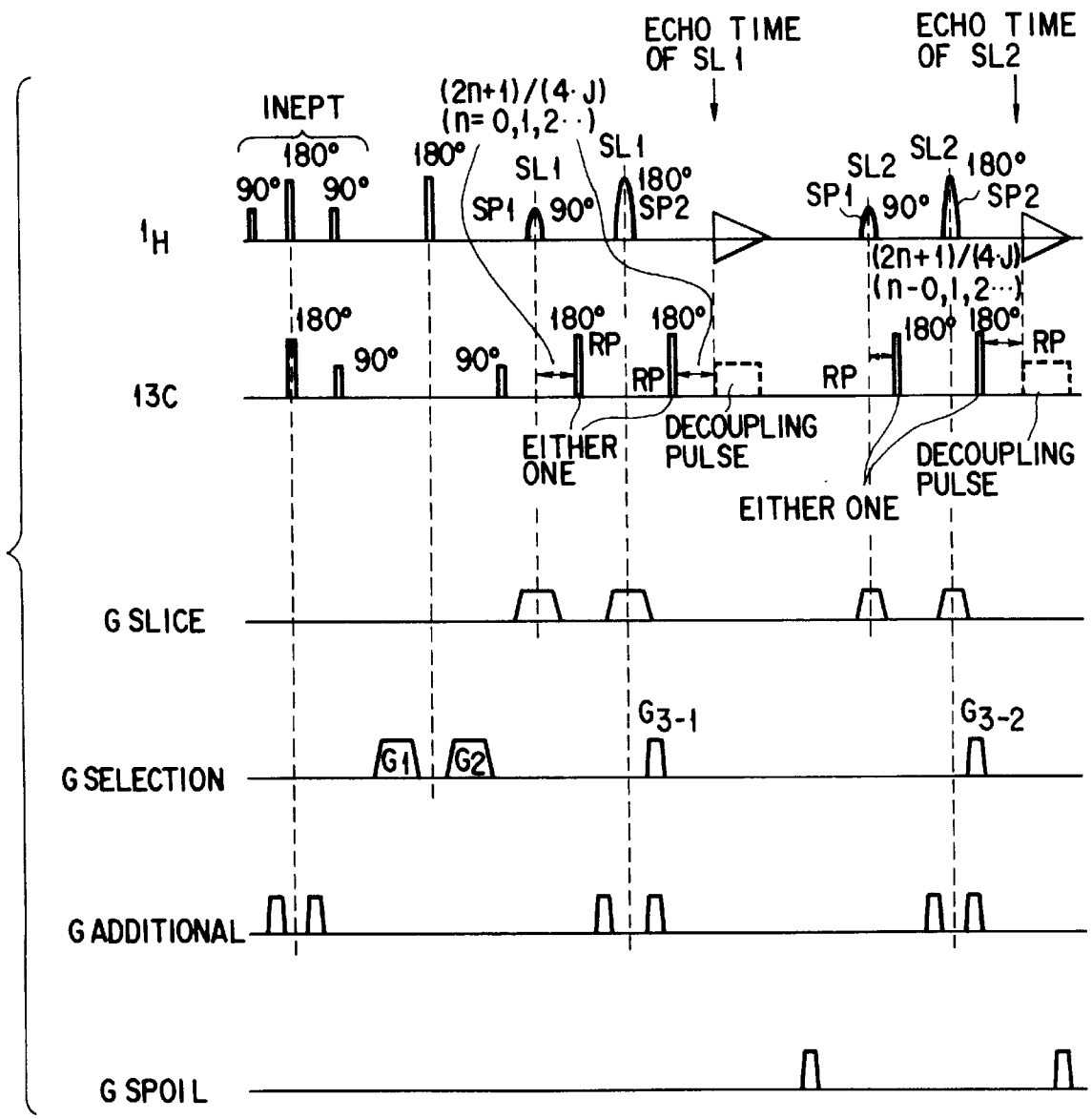
FIG. 13 is a view showing a pulse sequence using a reverse INEPT in the pulse sequence of FIG. 12.

In the pulse sequence in FIG. 12, those spectra slit at a J-coupling to the $^{13}$C are dephased. In the HSQC of Bodenhausen, therefore, the dephasing is corrected by the reverse INEPT when there occurs a polarization transfer from the $^{13}$C to the $^1$H. FIG. 13 shows a pulse sequence to which the above-mentioned pulse sequence is applied. In this example, a spin echo is produced with two RF pulses SP1, SP2 as slice select excitation pulses to the $^1$H. At (2n+1)/4·J (n=0, 1, 2, . . . ) after these two initial RF pulses SP1 or at (2n+1)/(4·J) (n=0, 1, 2, . . . ) before that echo time, inversion RF pulses RP'S are applied to the $^{13}$C and, by doing so, the time interval of the two RF pulses SP, SP2 is extended and the frequency characteristic, that is, the slice characteristic, of these pulses is improved (JPC PAT APPLN No. 7-82099).

The $^1$H chemical shift is refocused by the SP2 and $^{13}$C spin is reversed by the $^{13}$C inversion RF pulse RP. By doing so, these J-splitted spins can be set in an in-phase state. In this pulse sequence it is possible to apply decoupling pulse (dotted lines) to the $^{13}$C on observation of the $^1$H.

Heretofore, explanation has been made on the localization relating to the one axis (z axis) and now explanation will be given below on the three-axes localization.

Figure 14:
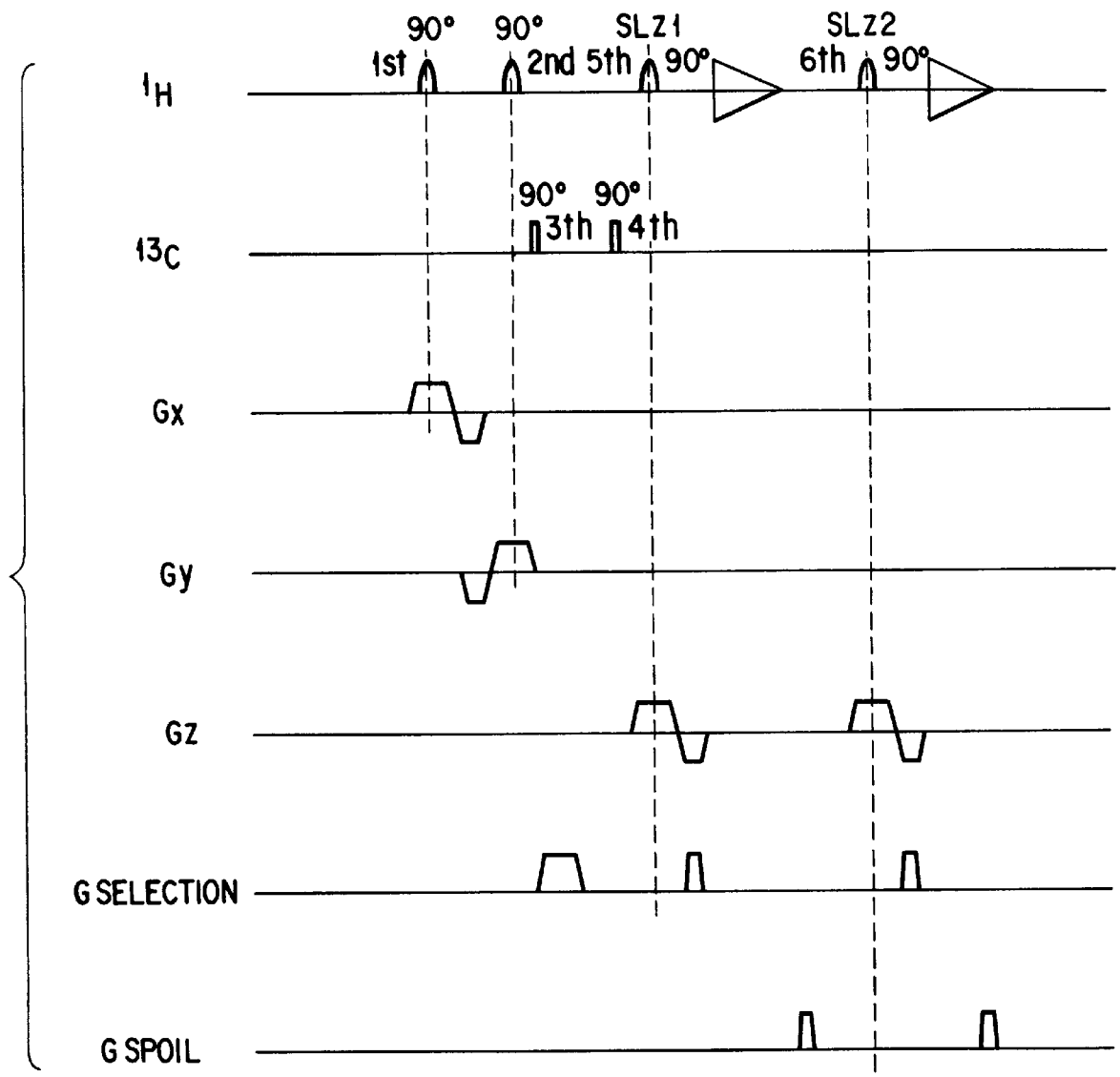
FIG. 14 is a view showing an example using a three-axes slice selection applied to the pulse sequence of FIG. 6.
Figure 16:
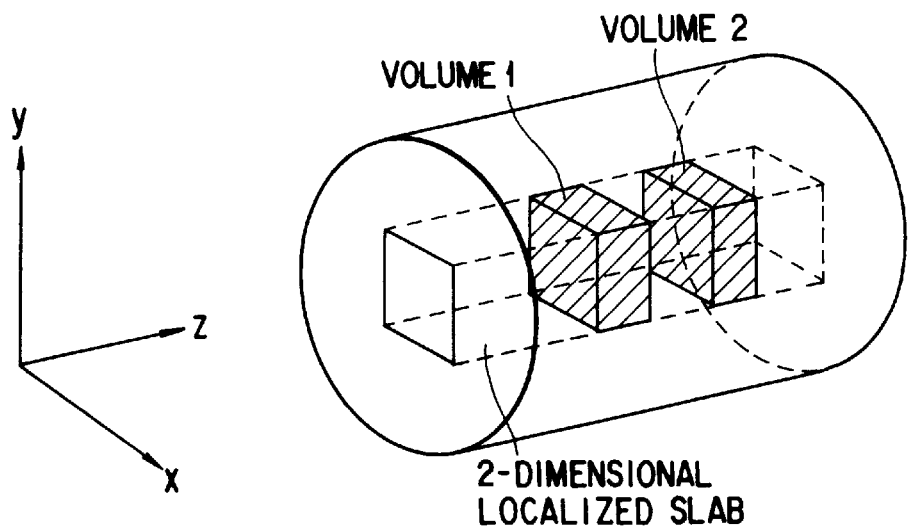
FIG. 16 shows a plurality areas localized with the pulse sequence of FIG. 15.

FIG. 14 shows a pulse sequence in which the pulse sequence of FIG. 6 is improved for the three-axes localization version. First and second RF pulses to the $^1$H, together with gradient magnetic field pulses Gx, Gy, are applied as slice select pulses relating to x and y axes. By doing so, it is possible to observe those signals corresponding to only those spins in a columnar region experiencing both the first and second RF pulses. And it is, therefore, possible to observe signals corresponding to two areas $_{volume}1$ and $_{volume}2$ (FIG. 16) sliced, by fifth and sixth RF pulses, at different positions in the columnar region.

Figure 15:
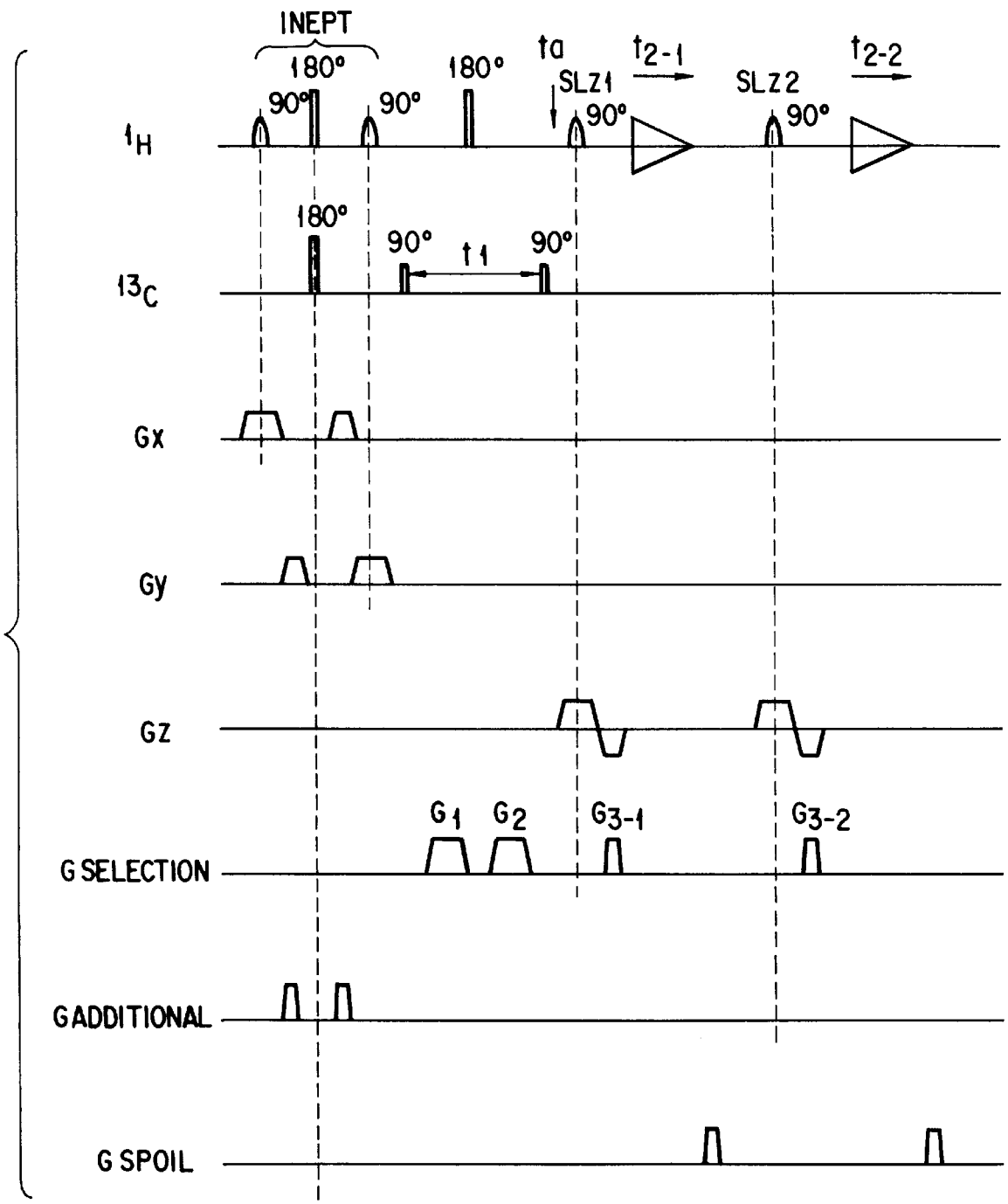
FIG. 15 is a view showing an example in which three-axes slice selection is applied to the pulse sequence of FIG. 12.
Figure 17:
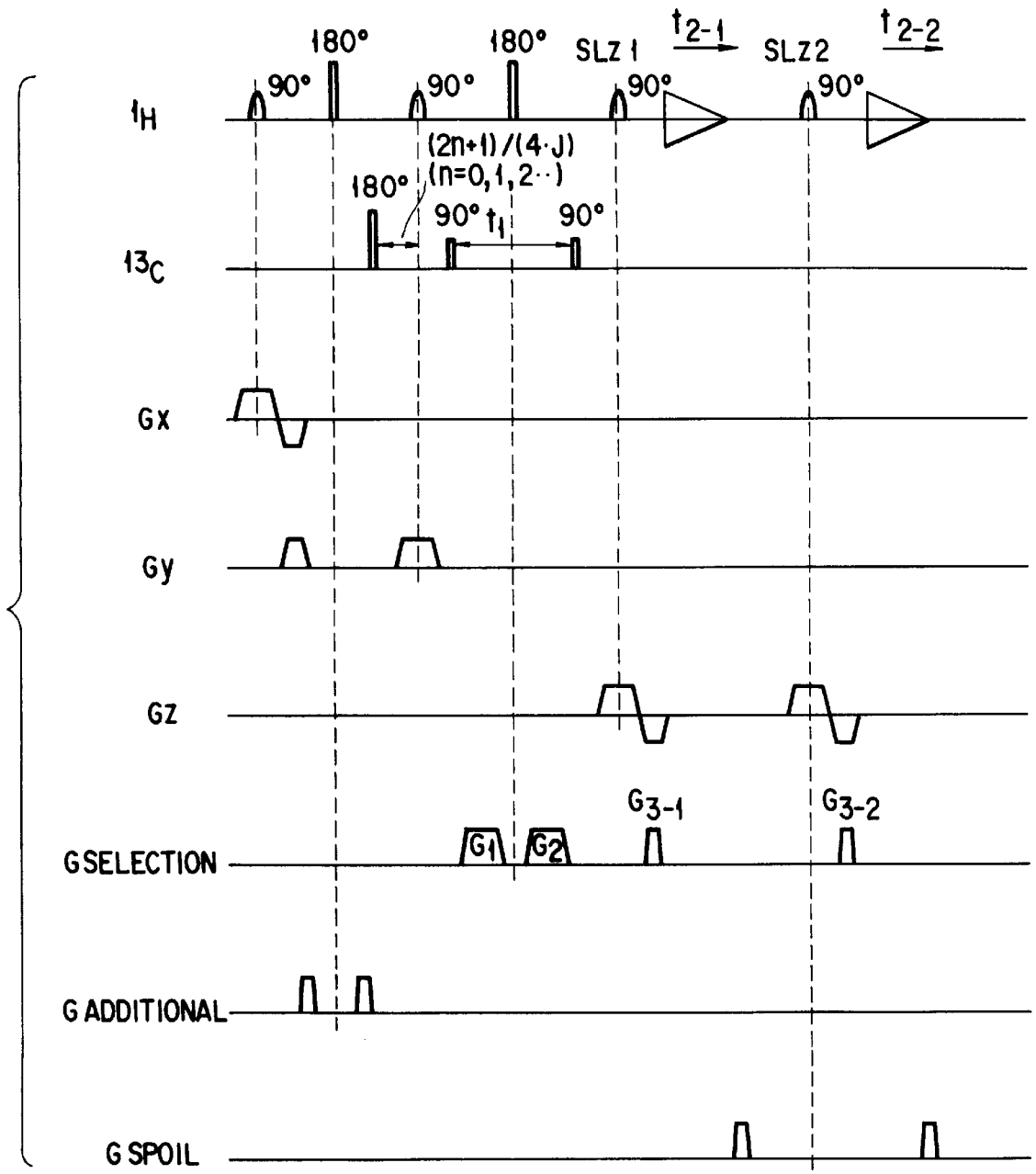
FIG. 17 is a view showing a pulse sequence with a $^1H$ echo time of an INEPT part of FIG. 15 set longer.

Even in the pulse sequence as shown in FIG. 12 it is possible to achieve the three-axes localization in the same way as in FIG. 14. This pulse sequence is shown in FIG. 15. In the pulse sequence shown in FIG. 15, as shown in FIG. 17 and explained in FIG. 13, it is only necessary that an initial inversion RF pulse to the $^{13}$C be applied at (2n+1)/(4·J) (n=0, 1, . . . ) before a third RF pulse to the $^1$H or at (2n+1)/(4·J) (n=0, 1, 2 . . . ) after a first RF pulse to the $^1$H. And it may be possible to broaden the interval of three RF pulses to the $^1$H and, by doing so, improve the frequency characteristic, that is, the slice profile characteristic, of these pulses.

In all the pulse sequences as set out above, it is also possible to use, as a slice selective excitation pulse, those RF pulses not utilized as such.

Even the pulse sequence corresponding to the three-axes localization shown in FIGS. 14, 15 and 17 can be applied to two-dimensional version in the $^{13}$C axis direction as set out in connection with FIG. 6. In this case, two-dimensional correlation spectra of the $^1$H and $^{13}$C can be acquired from respective local areas.

Figure 18:
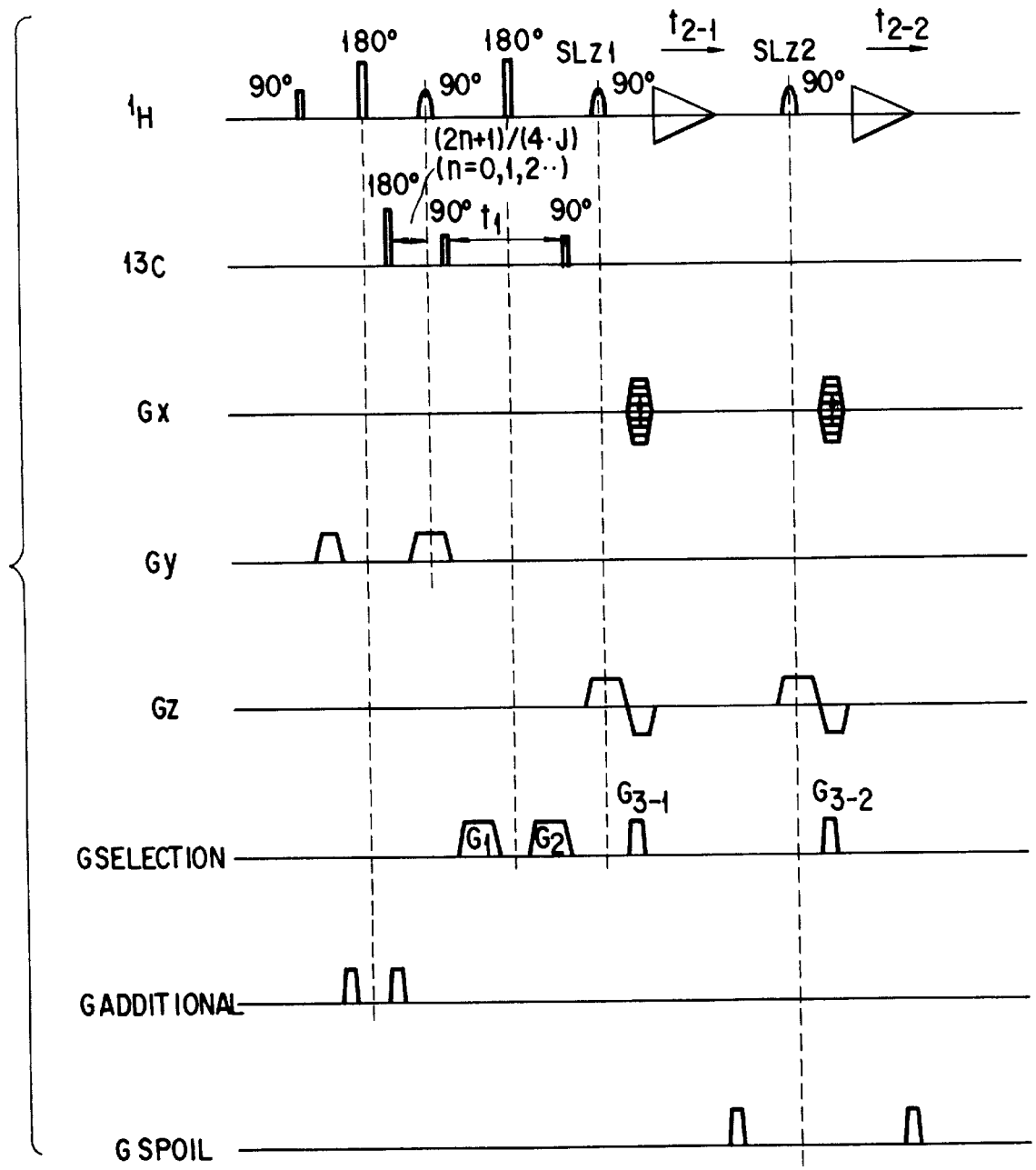
FIG. 18 is a view showing an example in which a two-dimensional mapping of a metabolic product is effected using a slice selection on a y-axis and phase encoding on the x-axis.

Now explanation will be given below about the mapping of a metabolic product. Although, in the above-mentioned embodiment, a plurality of slice select pulses together with the slice gradient pulses are applied after an evalution period (2IxSz state), it is only necessary to, for the mapping of the metabolities product, apply phase-encoding gradient magnetic field pulse in a direction different from the slice gradient magnetic field pulse. Such an example is shown in FIG. 18.

A phase encoding gradient pulse is applied at an interval between a fifth RF pulse (an SLZ1 in FIG. 18) to a first area and an MR signal detection time (t2-1) and between an interval between a sixth RF pulse (an SLz2 in FIG. 18) to a second area and an MR signal detection time (t2-2). By reconstructing those signals acquired in this sequence, it is possible to find a spatial distribution, that is, the mapping, in a plane defined by x and z axes.

Figure 19:
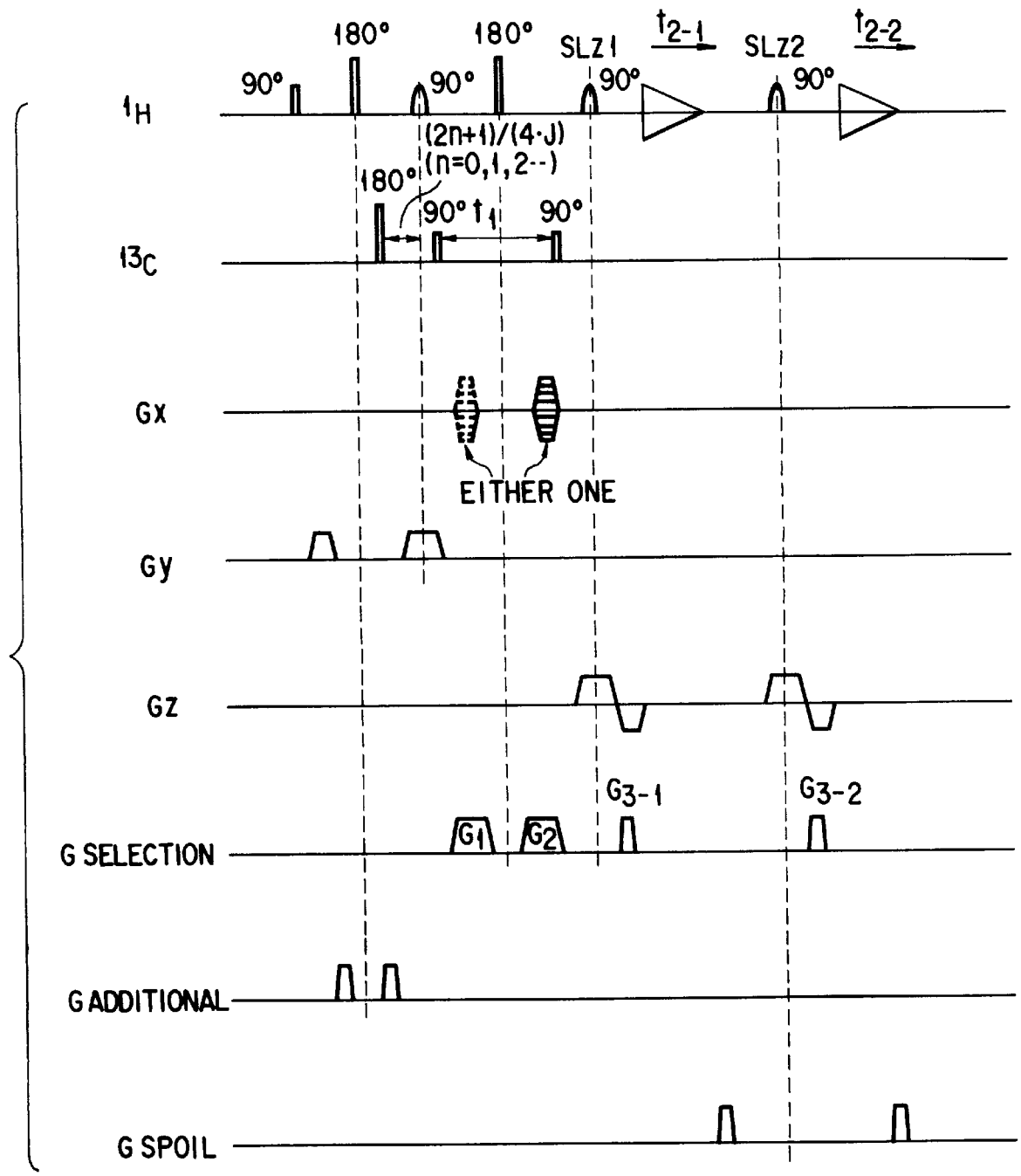
FIG. 19 is a view showing an example in which a phase encoding gradient magnetic field pulse is applied at an expansion time (t1)

The application time of the phase encoding gradient magnetic field pulse is not restricted to the above-mentioned time and this pulse may be applied in an evolution period (a t1 period) as shown in FIG. 19 so long as it is before the MR signal is acquired.

Figure 20:
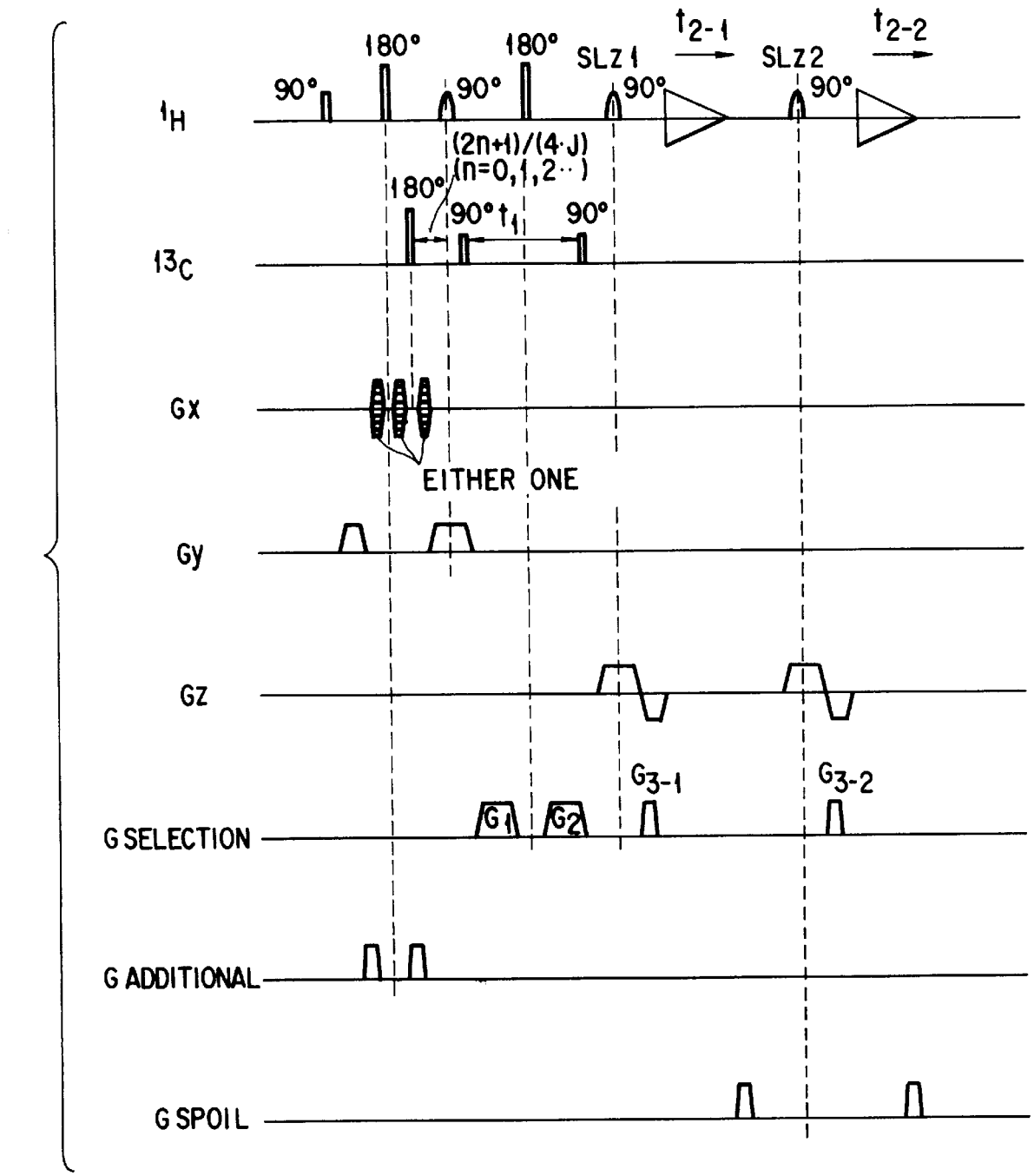
FIG. 20 is a view showing an example in which a phase encoding gradient magnetic field pulse is applied before polarization transfer.

Since, in the method shown in FIG. 19, the phases of water spins excited by the SLz1 and SLz2 pulses are not encoded, those signals corresponding to residual water are collected toward a center voxel after they are reconstructed. For this reason, the phase of any of the 90° pulses of the $^{13}$C, that is, a third RF pulse to the $^{13}$C promoting the start of the evolution time t1 and fourth RF pulse to the $^{13}$C ending the expansion time t1 are inverted each time the phase encoding is proceeded. By doing so, it is possible to separate a voxel corresponding to a $^{13}$C spectrum with a $^1$H sensitivity from the center voxel toward which the residual water signals are collected. It is possible to, as shown in FIG. 20, apply a phase encoding gradient magnetic field pulse in a preparation period.

Figure 22:
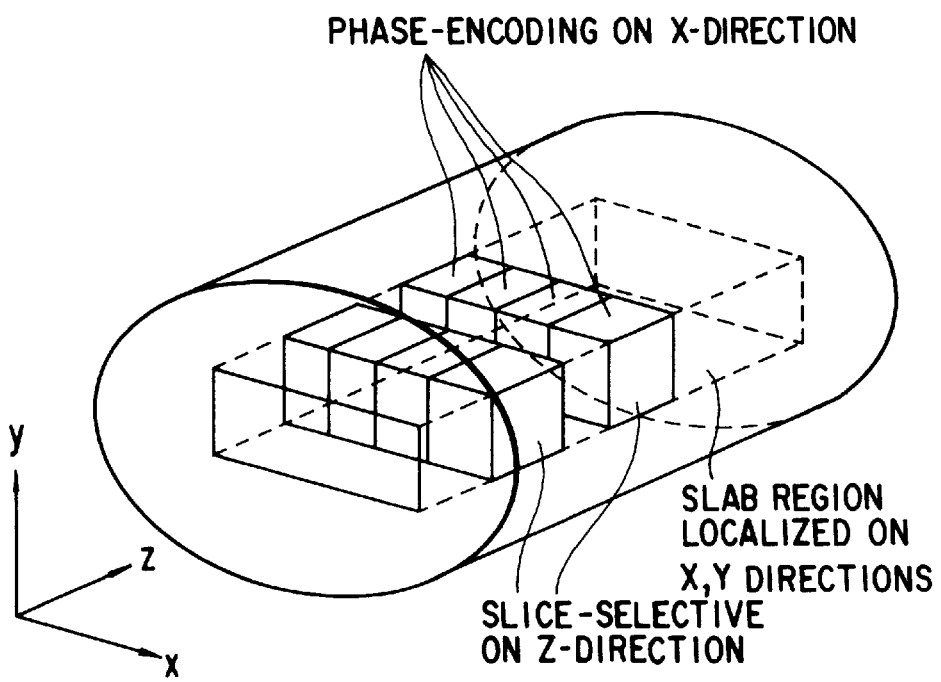
FIG. 22 is a model view showing a voxel structure corresponding to the pulse sequence of FIG. 21.
Figure 21:
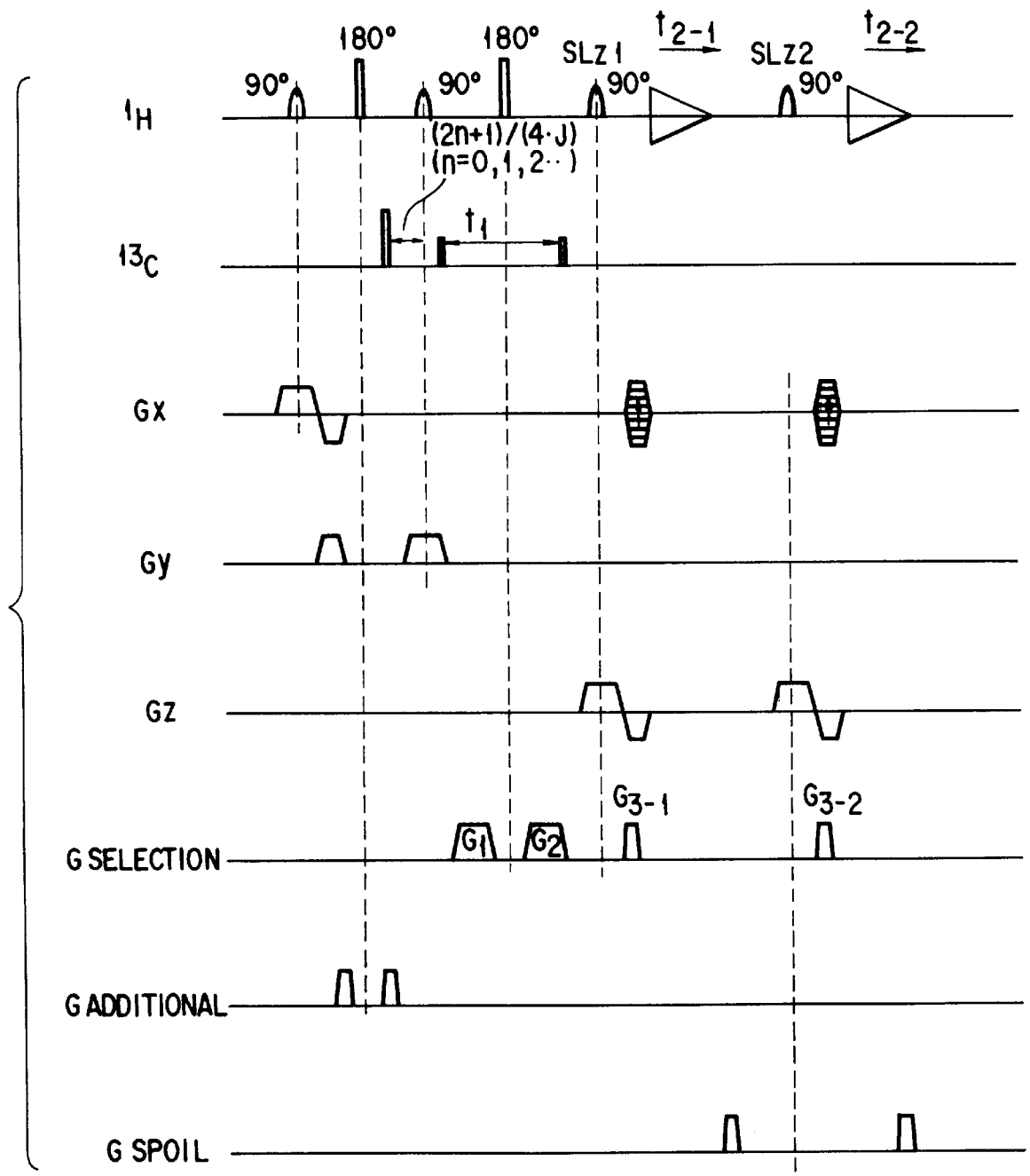
FIG. 21 is a view showing an example in which, with respect to an x-axis, slice selection is applied to the pulse sequence of FIG. 18.

As shown in FIG. 21, areas are initially localized by the slice selective pulse to a given extent in the encoding direction and, by doing so, it is possible to decrease the number of encoding steps involved and to reduce the scan time. FIG. 22 shows those voxels mapped in the sequence of FIG. 21. That is, since the areas are initially defined in the x direction, it is possible to reduce the number of phase encoding steps in the x direction.

Figure 23:
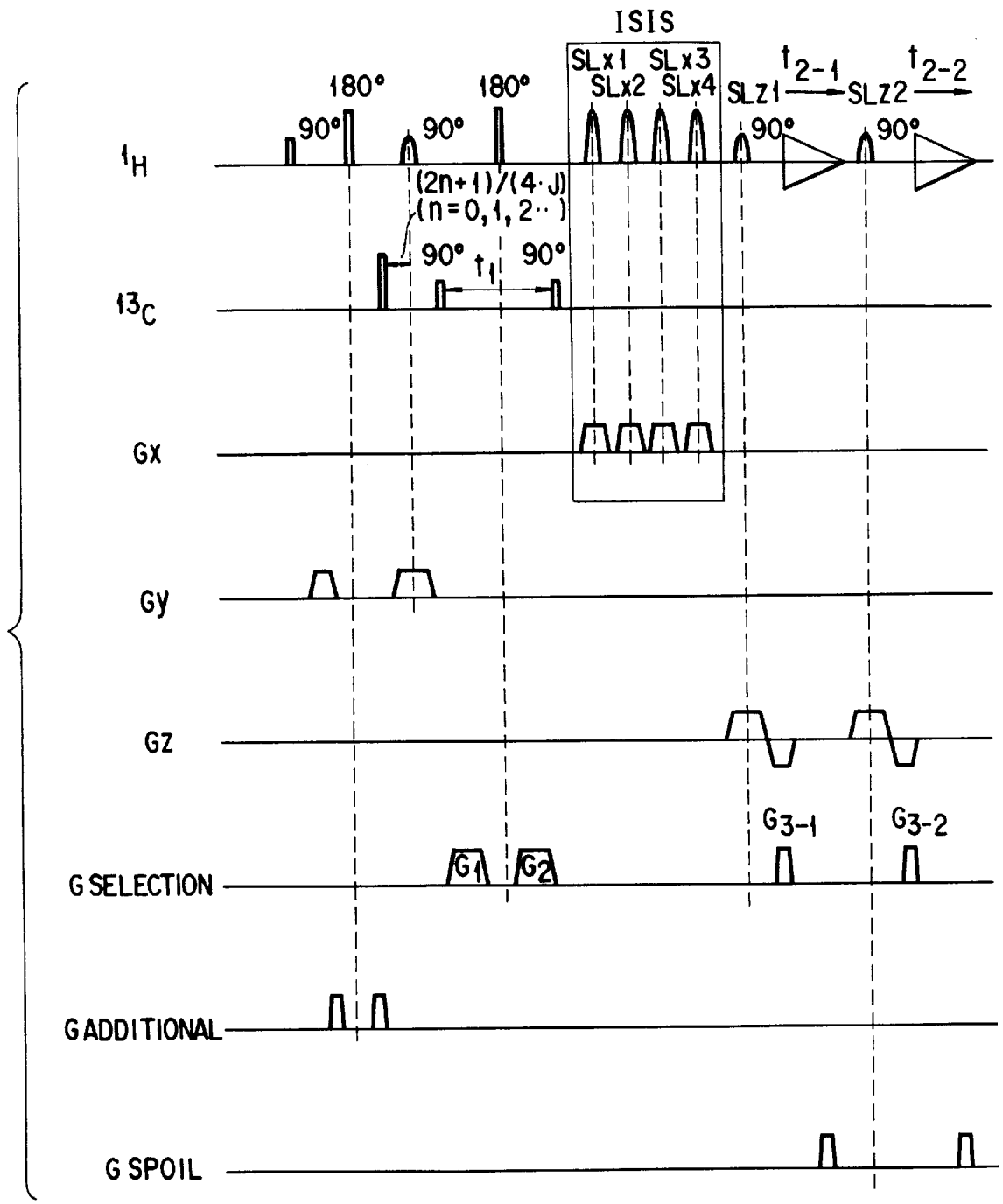
FIG. 23 is a view showing an example in which the phase encoding of the pulse sequence in FIGS. 18, 19 and 20 is replaced with an ISIS pulse sequence.

Using, in place of the encoding gradient magnetic field pulse, the method (J. Magn. Reson. Vol 80, p.162 to p.167, 1988) of Lizann Bolinger et al., with the ISIS method applied to the multi-voxel structure it is also possible to implement mapping. This is the method for applying a plurality of $^1$H inversion RF pulses during a period of a longitudinal magnetization state (longitudinal spin order) of the $^1$H and $^{13}$C and, in the sequence as set out above in FIG. 6, applying them in either one of (1) before the application of a first RF pulse, (2) at an interval between a second RF pulse and a third RF pulse and (3) at an interval between a fourth RF pulse and a fifth RF pulse. Further, in the case where an x axis-direction information is obtained at the area alone selected with a sixth RF pulse, it is only necessary to apply a plurality of $^1$H inversion RF pulses in an interval between the fifth RF pulse and the detection of the MR signal. FIG. 23 shows a sequence with the present invention applied to the HSQC by Bondenhansen. In this method, a multi-voxel structure is shown with respective four voxels defined in the x-axis direction by way of example.

Figure 24:
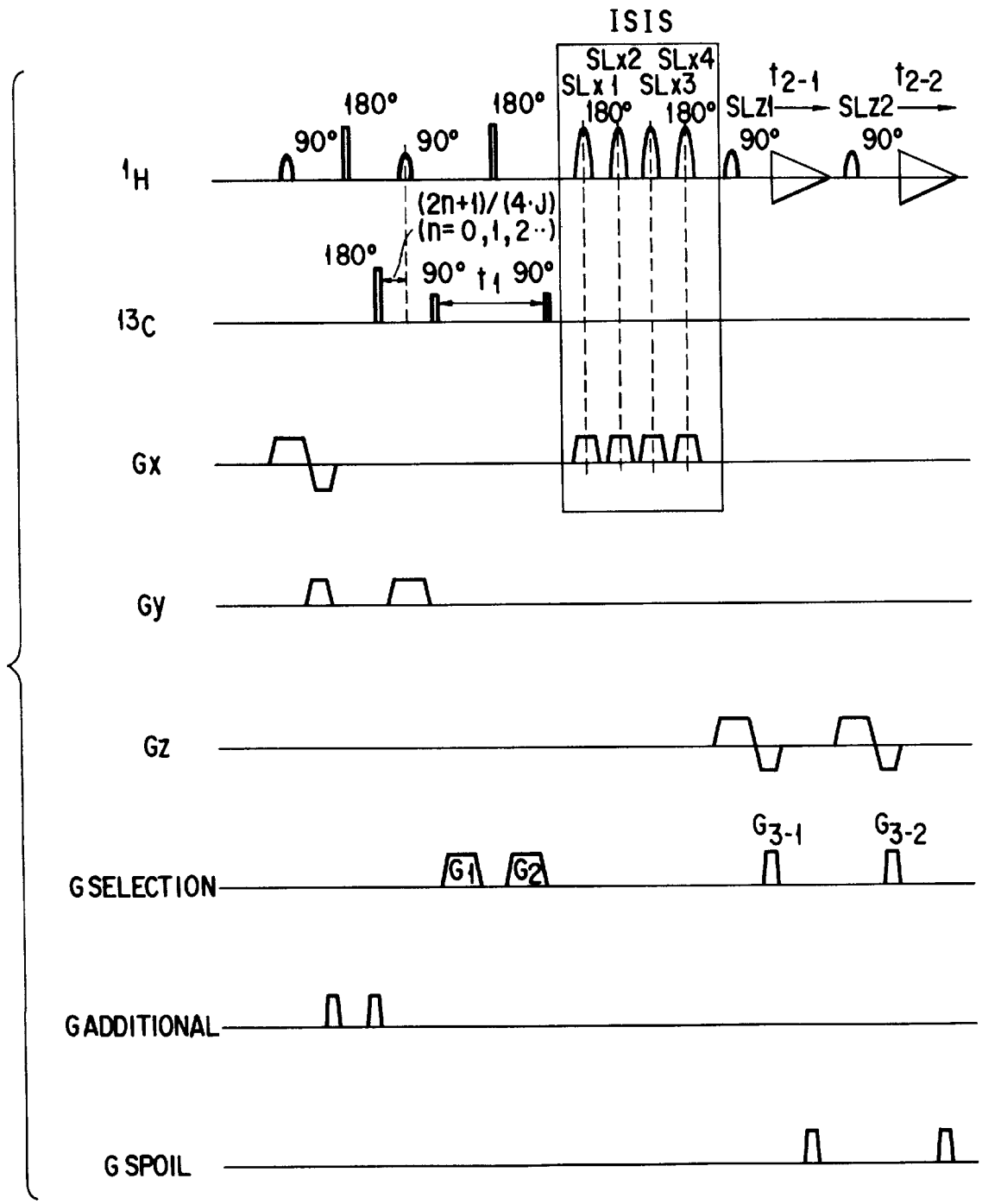
FIG. 24 is a view showing an example in which the phase encoding of the pulse sequence of FIG. 21 is replaced with the ISIS pulse sequence.

As in the example of FIG. 21, it is possible to reduce the scan time by initially adequately localizing regions of interest by the slice select excitation pulses as shown in FIG. 24.

In this sequence, the $^1$H spins magnetically coupled to the $^{13}$C in the slab localized in a two-dimensional x, y axis direction after the RF pulse is applied to $^{13}$C after a time t1 is set in a longitudinal state 2IzSz. By applying slice selective inversion RF pulses SLx1 to SLx4, in this state, to the $^1$H, at each scanning, with an x-axis phase as set out below it is possible to localize the area to the voxels with respect with the x axis as shown in FIG. 24. In this connection it is to be noted that ON represents an application of an inversion RF pulse and OFF, no application of the inversion RF pulse.

TABLE 1

|  | S1x1 | S1x2 | S1x3 | S1x4 |
| --- | --- | --- | --- | --- |
| Signal 1 (S1) | OFF | OFF | OFF | OFF |
| Signal 2 (S2) | OFF | ON | OFF | ON |
| Signal 3 (S3) | OFF | OFF | ON | ON |
| Signal 4 (S4) | OFF | ON | ON | OFF |

Those signals of localized areas V11, V12, V13 and V14 in the area (SLz1) in FIG. 25 for instance can be found by an equation (9) below for matrix transformation.

$$\begin{bmatrix} V11 \\ V12 \\ V13 \\ V14 \end{bmatrix} = \begin{bmatrix} 1/4 & 1/4 & 1/4 & 1/4 \\ 1/4 & -1/4 & 1/4 & -1/4 \\ 1/4 & 1/4 & -1/4 & -1/4 \\ 1/4 & -1/4 & -1/4 & 1/4 \end{bmatrix} \begin{bmatrix} S1 \\ S2 \\ S3 \\ S4 \end{bmatrix} \quad (9)$$

Figure 25:
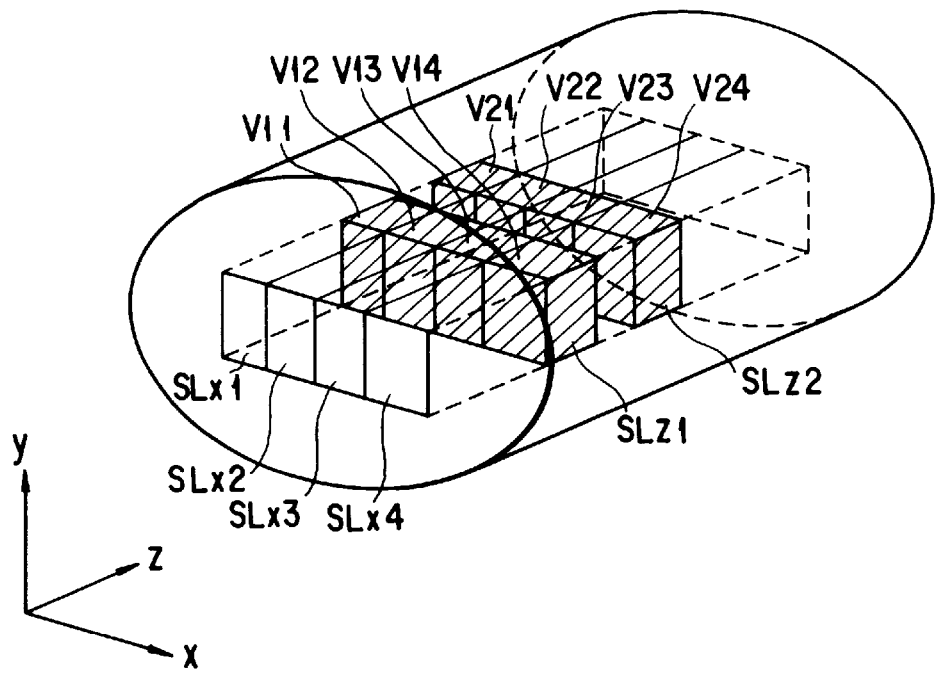
FIG. 25 is a model view showing a voxel structure corresponding to the pulse sequence of FIG. 24.

Those signals of voxels V21, V22, V23 and V24 in the area (SLz2) in FIG. 25 can be similarly found by a matrix transformation. By doing so, it is possible to obtain the mapping of the metabolic product in the x and z axes directions.

Figure 27:
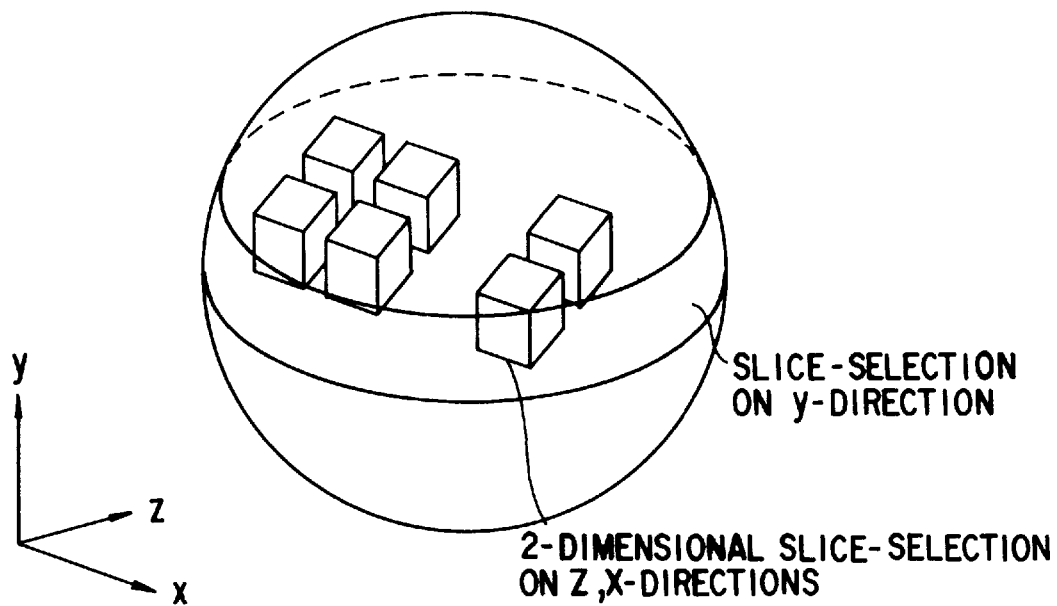
FIG. 27 is a model view showing voxels corresponding to the pulse sequence of FIG. 26.
Figure 26:
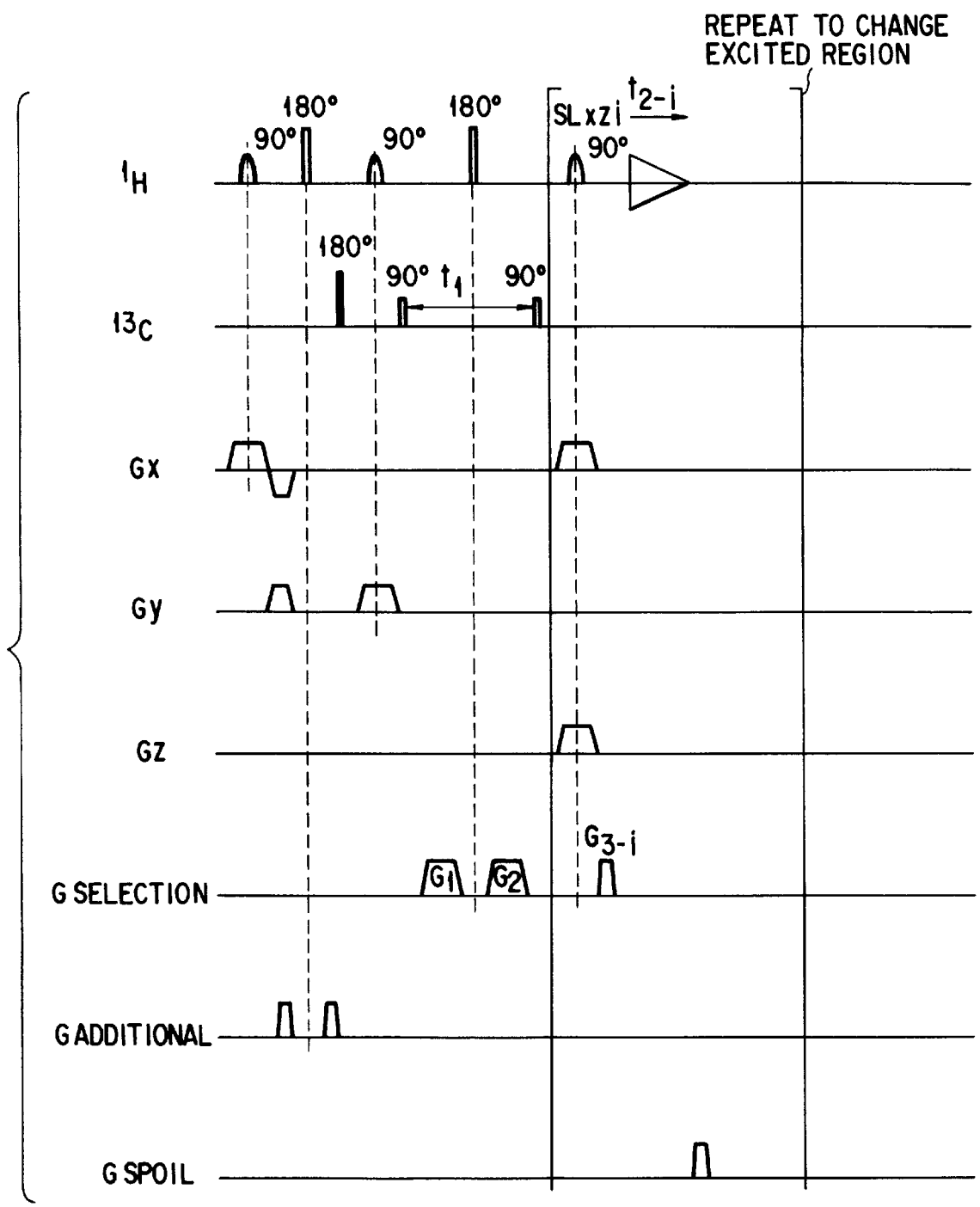
FIG. 26 is a view showing an example in which, against three-axes, a slice selection is applied without applying phase encoding.

For mapping metabolities, it is possible to observe signals in voxel units with the use of a multi-dimensional excitation pulse form for applying one slice selective excitation pulse and two-axes gradient pulses. FIG. 26 shows this pulse sequence. According to this method, after returning the polarization transfer back to the $^1$H after the passage of a time t1, 2-axes gradient magnetic field pulses Gx, Gz, together with the slice selective excitation pulse (Slxzi) are simultaneously applied and, as shown in FIG. 27, a signal from a voxel localized with respect to two (x, y) axes is observed. This is excited n times while varying the voxel position and, by doing so, it is possible to obtain signals, by one scanning, relating to the n number of voxels.

Figure 28:
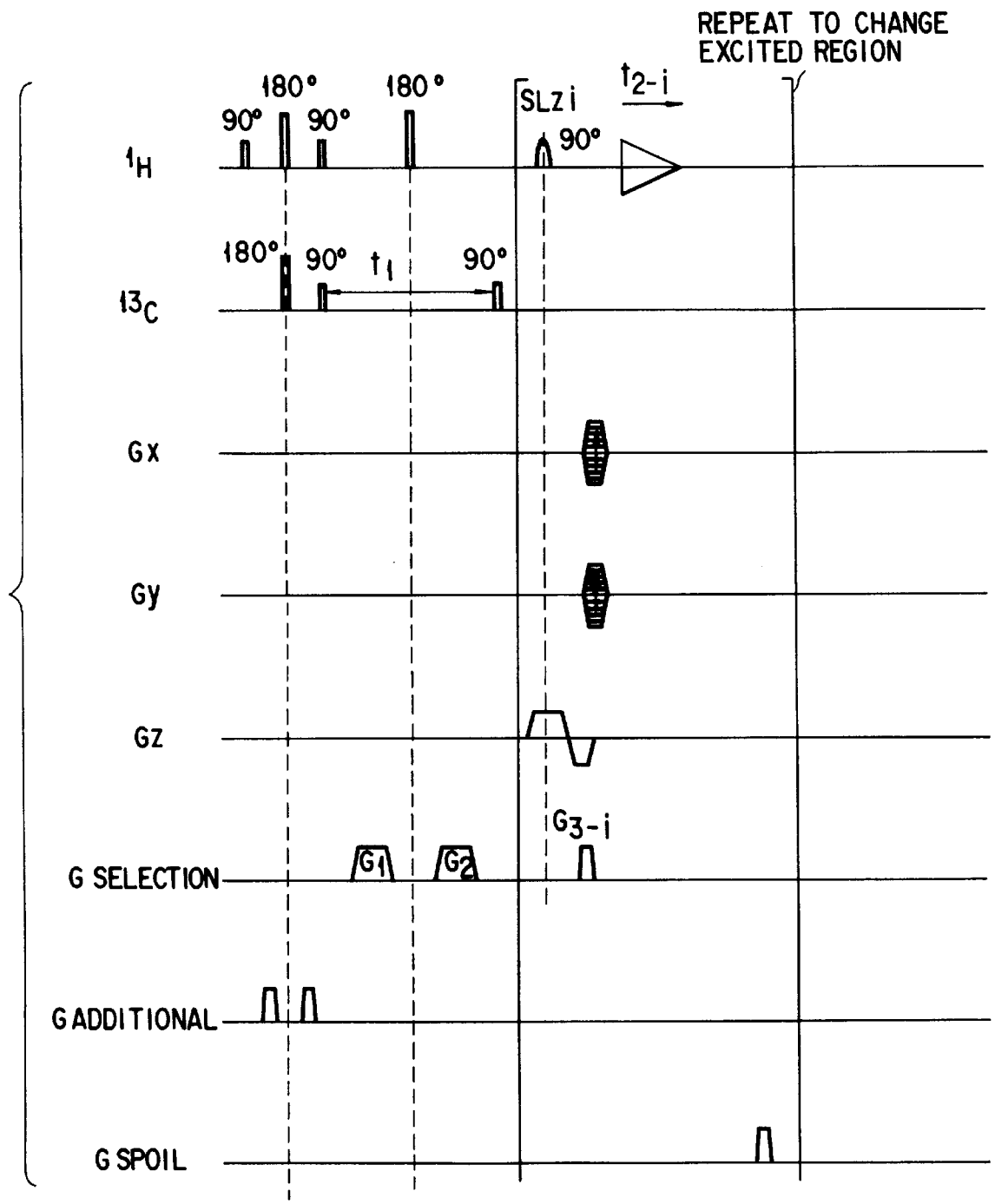
FIG. 28 is a view showing an example in which, against two axes, the phase encoding is applied.
Figure 29:
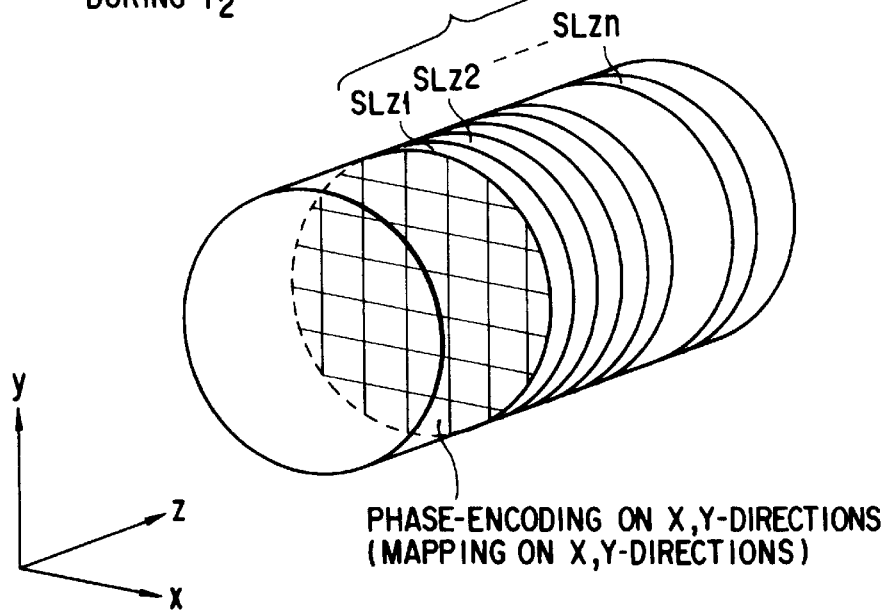
FIG. 29 is a model view showing voxels corresponding to the pulse sequence of FIG. 28.

Then explanation will be given below about the mapping on the three-dimensional areas. FIG. 28 shows this pulse sequence and FIG. 29 is a view showing a model in a subject. In this pulse sequence, after the polarization transfer from $^1$H to $^{13}$C and creation of a spin state (2IzSz) via a time t1, a slice selective pulse (Slzi) is applied in a Z-axis direction and phase encoding gradient magnetic field pulses Gx, Gy with respect to the x, y two-axes are applied. Then the signal is observed. This is repeated n times and resultant signals are reconstructed. By doing so it is possible to perform a spatial three-dimensional mapping.

Various changes or modifications of the invention can be made without restricting the present invention to the above-mentioned embodiments. In order to prevent a mixing of signals other than the desired signals, it is possible to apply a phase cycle of alternately inverting the phase of the RF pulse or the phase of reception signal.

Although the selective excitation is repeated after the evolution time t1, the longitudinal relaxation proceeds of course, in a rather long while, during this period. Thus, the relaxation effects signal intensities and losses quantification among the slices or the voxels. In order to calibrate such signals among the slices or voxels, it is only necessary to change the order of excitations, for example, for each scanning. This will be explained below with the use of the pulse sequence of FIG. 9. In FIG. 9, areas S1 and S2 are scanned in this order. In this case, the area S2 whose signal is later observed experiences more effect of relaxation than the area S1. At the next scanning, therefore, signal observation is first effected from the area S2 and then signal observation is effected from the area S1. By thus changing the order of observations for each scan and subjecting the signal to addition, etc., it is possible to eliminate the above-mentioned signal irregularity.

Further, by changing the interval between the RF pulse to the $^{13}$C after a time t1 and the first slice select excitation pulse after the time t1 it is possible to find a 2IzSz state-relaxation time of those spins corresponding to the area S1. Also the relaxation time of those spins corresponding to other areas can be calculated and, by doing so, it is possible to correct the relaxation effects.

Figure 30:
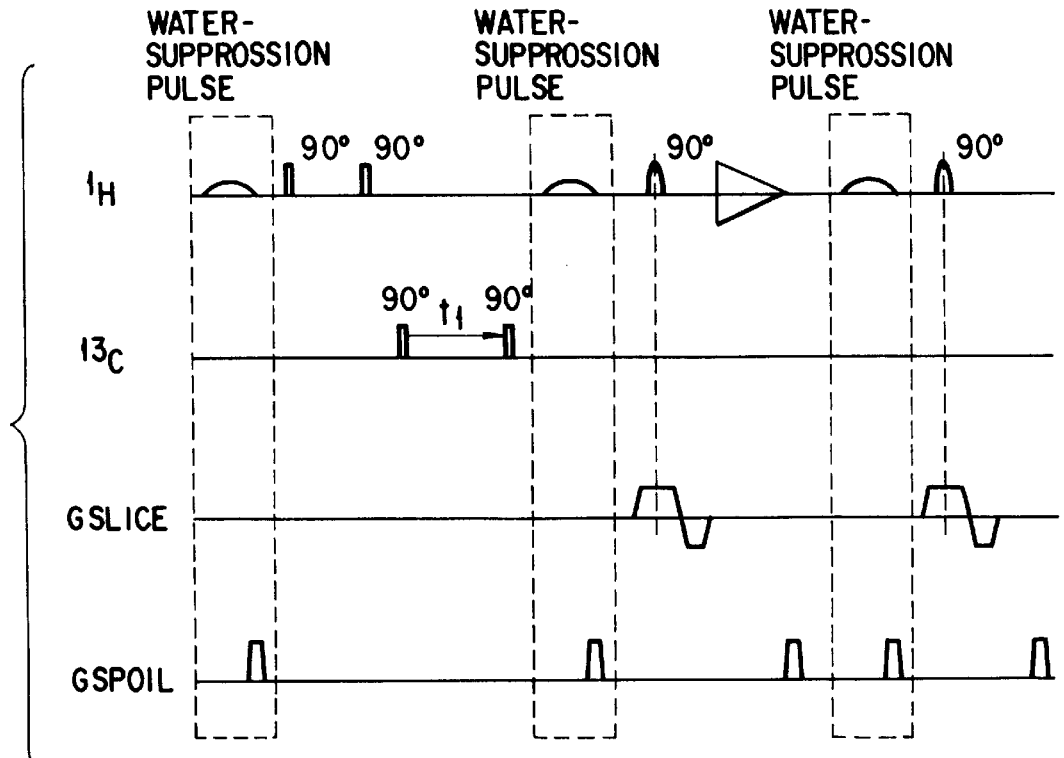
FIG. 30 is an example in which a water suppression pulse is applied immediately prior to signal detection.

It may be possible to, as shown in FIG. 30, apply a water-suppression pulse before a slice select excitation pulse in the 2IzSz state and, by doing so, improve a water suppression rate. In this case, it is possible to apply a water-suppression pulse before a respective slice select excitation pulse because the spin state is set to be a 2IzSz.

Further it is possible to perform the so called "oblique" shot whereby the slice gradient magnetic field pulse applied upon application of a respective RF pulse is used as gradient magnetic field pulses relating to a plurality of axes.

Figure 31:
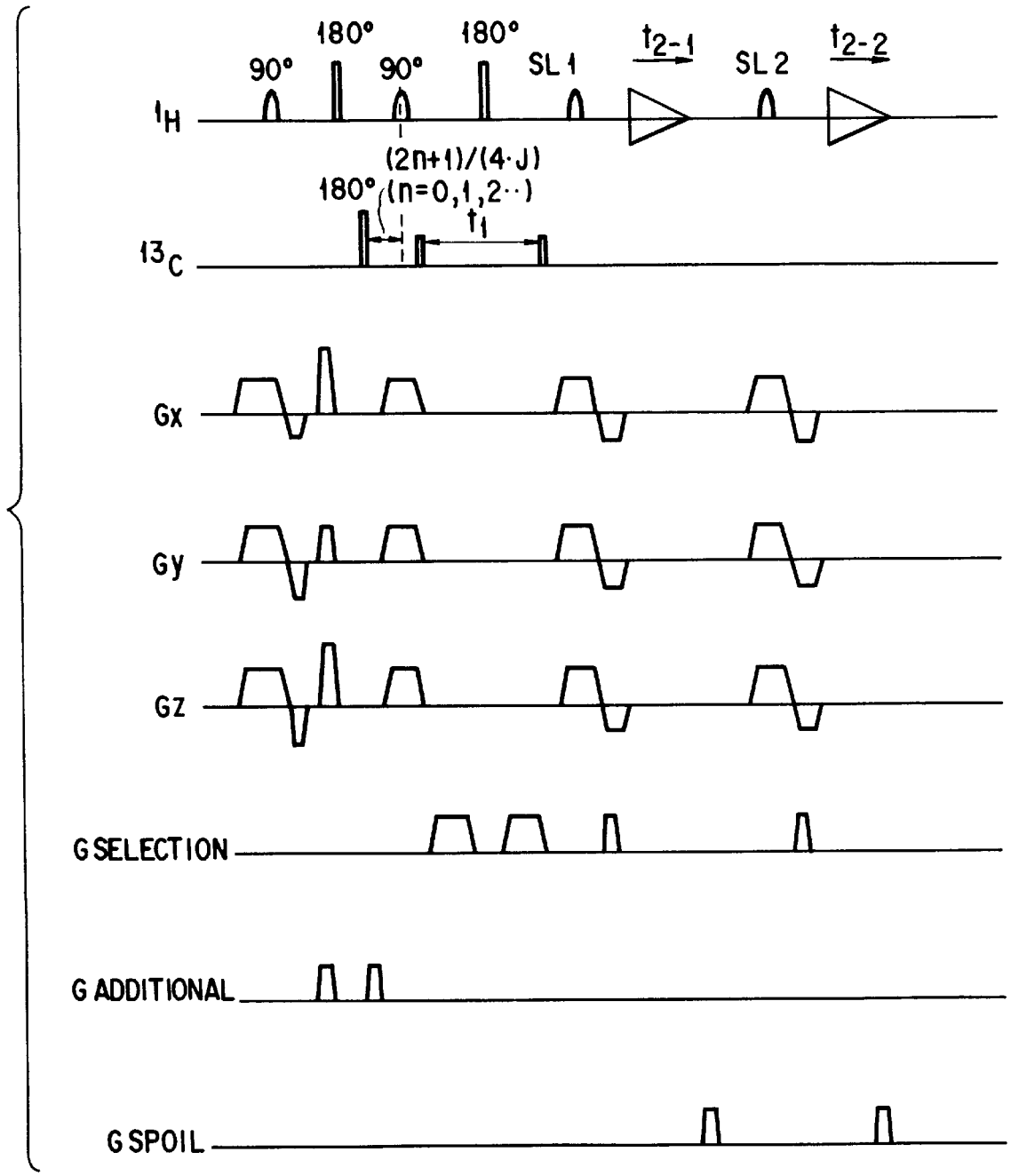
FIG. 31 is a view showing an example using an oblique shot.

Although explanation will be given about the localization about the x-, y- and z-directions in the embodiment above, all the sequences above can be applied to the oblique shot. That is, it is possible to, in all the sequences above, apply gradient magnetic field pulses (a set of gradient magnetic field pulses) not to only one axis at a time but to a plurality of axes together with the slice select pulse and, by doing so, to effect localization in any give directions. FIG. 31 shows one form of the present embodiment. In this form of the embodiment, although first and second ones of 90° pulses to the $^1$H and SLz1, SLz2 are used as a slice select pulse, it is possible to use any of the respective $^1$H pulses as a slice selective pulse. Regarding the respective slice select pulses, all the gradient magnetic field pulses of all the Gx, Gy, Gz three axes are applied together with the slice selective pulse. In order to acquire the $^{13}$C spectrum from a plurality of areas it is only necessary that an area selected by first and second slice select pulses and SL1 and an area selected by first and second slice select pulses and SL2 be set to be different.

Further, if the sequence is so set that there is no matching between a normal line of a plane selected by the first slice select pulse and that of a plane selected by the second slice select pulse, a columnar region is selected by these two pulses. For this reason, it is only necessary to apply such a sequence that the strength ratio of those gradient magnetic field pulses on respective axes applied together with the first slice select pulse and that of those gradient magnetic field pulses on the respective axes applied together with the second slice select pulse are so set to be different. It is possible to acquire an HSQC signal corresponding to a three-dimensional localized area by applying, together with SL1, such a set of gradient magnetic field pulses as to select a plane having a normal line different from both a normal line of a plane selected by a first slice select pulse and a normal line of a plane selected by a second slice select pulse. And by applying such an SL2 pulse as to select an area different from the area involved, it is possible to achieve an oblique localization excitation.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A magnetic resonance apparatus comprises:
    first applying means for applying, to a first nuclide of a subject, an RF pulse corresponding to a resonance frequency of the first nuclide;
    second applying means for applying, to a second nuclide whose spins are magnetically coupled to the first nuclide, an RF pulse corresponding to a resonance frequency of the second nuclide;
    gradient magnetic field applying means for applying a gradient magnetic field;
    detecting means for detecting the MR signal from the spins of the first nuclide; and control means for controlling the first applying means, second applying means, gradient magnetic field applying means and detecting means in accordance with a predetermined pulse sequence, wherein, in the predetermined pulse sequence, first and second RF pulses are applied to the first nuclide and, simultaneously with or after application of the second RF pulse, a third RF pulse is applied to the second nuclide magnetically coupled to the spins of the first nuclide, whereby there occurs a first polarization transfer from spins of the first nuclide to spins of the second nuclide;

a fourth RF pulse is applied to the spins of the second nuclide after the first polarization transfer;

after the application of the fourth RF pulse, a fifth RF pulse is applied to the first nuclide together with at least one slice gradient magnetic field pulse, whereby the spins of the first nuclide in the first area are selectively excited, there occurs a second polarization transfer from the spin of the second nuclide to the spin of the first nuclide and those first MR signals are collected from the spins of the first nuclides in the first area experiencing the first and second polarization transfers; and after the collection of the first MR signals, a sixth RF pulse is applied to the first nuclide together with at least slice gradient magnetic field pulse, whereby the spins of the first nuclides in a second area are selectively excited, there occurs a third polarization transfer from the spin of the second nuclide to the spin of the first nuclide and those second MR signals are collected from the spins of the first nuclides in the second area experiencing the first and third polarization transfers.

2. The apparatus according to claim 1, wherein the gradient magnetic field for phase encoding is applied in at least one of an interval between the first RF pulse and the second RF pulse and interval between the third RF pulse and the fourth RF pulse.

3. The apparatus according to claim 2, wherein at least one of the RF pulses other than the fifth and the sixth RF pulses is applied together with the gradient magnetic field pulse for slice selection.

4. The apparatus according to claim 1, wherein the gradient magnetic field for phase encoding is applied in at least one of an interval between the application of the fifth RF pulse and the detection of the first MR signal and an interval between the application of the sixth RF pulse and the detection of the second MR signal.

5. The apparatus according to claim 4, wherein at least one of the RF pulses other than the fifth and the sixth RF pulses is applied together with the gradient magnetic field pulse.

6. The apparatus according to claim 1, wherein an inversion RF pulse to the first nuclide is applied in at least one of, before the first RF pulse, in an interval between the second RF pulse and the third RF interval and in an interval between the fourth RF pulse and the fifth RF pulse.

7. The apparatus according to claim 6, wherein at least one of the RF pulses other than the fifth and the sixth RF pulses is applied together with the gradient magnetic field pulse for slice selection.

8. The apparatus according to claim 1, wherein at least one of the RF pulses other than the fifth and the sixth RF pulses is applied together with the gradient magnetic field pulse for slice selection.

9. A magnetic resonance apparatus comprising:

first applying means for applying, to a first nuclide of a subject, an RF pulse corresponding to a resonance frequency of the first nuclide;

second applying means for applying, to a second nuclide magnetically coupled to the spins of the first nuclide, an RF pulse corresponding to a resonance frequency of the second nuclide;

gradient magnetic field applying means for applying a gradient magnetic field;

detecting means for detecting the MR signal from the spins of the first nuclide; and control means for controlling the first applying means, second applying means, gradient magnetic field applying means and detecting means in accordance with a predetermined pulse sequence, whereby in the predetermined pulse sequence first and second RF pulses are applied to the first nuclide, a third RF pulse is applied, simultaneously with or after the application of the second RF pulse, to the second nuclide magnetically coupled to the spins of the first nuclide, a refocusing RF pulse to the first nuclide and an inversion RF pulse to the second nuclide are applied at an interval between the first RF pulse and the second RF pulse, whereby there occurs a first polarization transfer from the spins of the first nuclide to the spins of the second nuclide;

a fourth RF pulse is applied to the second nuclide after the first polarization transfer;

after the application of the fourth RF pulse, a fifth RF pulse to the first nuclide is applied together with at least one of slice gradient magnetic field pulses, whereby the spins of the first nuclide in a first area are selectively excited, there occurs a second polarization transfer from the spin of the second nuclide to the spin of the first nuclide and those first MR signals are collected from those spins of the first nuclides in the first area experiencing the first and second polarization transfers; and after the collection of the first MR signals, a sixth RF pulse to the first nuclide is applied together with at least one of the slice gradient magnetic field pulses, whereby the spins of the first nuclide in a second area are selectively are excited, there occurs a third polarization transfer from the spin of the second nuclide to the spin of the first nuclide and those second MR signals are collected from those first nuclides in a second area experiencing the first and third polarization transfers.

10. The apparatus according to claim 9, wherein the gradient magnetic field for phase encoding is applied both in at least one of an interval between the first RF pulse and the second RF pulse and interval between the third RF pulse and the fourth RF pulse and in an interval in which the refocusing RF pulse and inversion RF pulse are not applied.

11. The apparatus according to claim 10, wherein at least one of the RF pulses other than the fifth and the sixth RF pulse and refocusing RF pulse is applied together with the gradient magnetic field pulse for slice selection.

12. The apparatus according to claim 9, wherein the gradient magnetic field for phase encoding is applied in at least one of an interval between the application of the fifth RF pulse and the detection of the first MR signal and interval between the application of the sixth RF pulse and the detection of the second MR signal.

13. The apparatus according to claim 12, wherein at least one of the RF pulses other than the fifth and the sixth RF pulse and refocusing RF pulse is applied together with the gradient magnetic field pulse for slice selection.

14. The apparatus according to claim 9, wherein an inverted pulse to the first nuclide is applied in at least one of below the first RF pulse, in an interval between the 2RF pulse and the third RF pulse and in an interval between the fourth RF pulse and the fifth RF pulse.

15. The apparatus according to claim 14, wherein at least one of the RF pulses other than the fifth and the sixth RF pulse is applied together with the gradient magnetic field pulse for slice selection.

16. The apparatus according to claim 9, wherein at least one of the first RF pulse, second RF pulses other than the fifth and the sixth RF pulses and refocusing RF pulse is applied together with the gradient magnetic field pulse for slice selection.

17. A magnetic resonance apparatus comprising:

first applying means for applying, to a first nuclide of a subject, an RF pulse corresponding to a resonance frequency of the first nuclide;

second applying means for applying, to a second nuclide magnetically coupled to the spins of the first nuclide, an RF pulse corresponding to a resonance frequency of the second nuclide;

gradient magnetic field applying means for applying a gradient magnetic field;

detecting means for detecting the MR signal from the spins of the first nuclide; and control means for controlling the first applying means, second applying means, gradient magnetic field applying means and detecting means in accordance with a predetermined pulse sequence, whereby in the predetermined pulse sequence first and second RF pulses are applied to the first nuclide and a third RF pulse is applied, simultaneously with or after the application of the second RF pulse, to the second nuclide magnetically coupled to the spins of the first nuclide, whereby there occurs a first polarization from the spins of the first nuclide to the spins of the second nuclide;

after the first polarization transfer, a fourth RF pulse is applied to the second nuclide;

the RF pulse to the first nuclide is applied at an interval between the third RF pulse and the fourth RF pulse;

after the application of the fourth RF pulse, a fifth RF pulse to the first nuclide is applied together with at least one slice gradient magnetic field pulse, whereby the spins of the first nuclide in the first area are selectively excited, there occurs a second polarization transfer from the spins of the second nuclide to the spins of the first nuclide and those first MR signals are collected from those spins of the first nuclides in the first area experiencing the first and second polarization transfers; and after the collection of the first MR signals, a sixth RF pulse to the first nuclide is applied together with at least one slice gradient magnetic field pulse, whereby the spins of the first nuclides in the second area are selectively excited, there is a third polarization transfer from the spins of the second nuclide to the spins of the first nuclide and those second MR signals are collected from those spins of the first nuclides in the second area experiencing the first and second polarization transfers.

18. The apparatus according to claim 17, wherein the gradient magnetic field for phase encoding is applied both in at least one of an interval between the first RF pulse and the second RF pulse and interval between the third RF pulse and fourth pulse and in a period in which the refocusing and inversion RF pulses are not applied.

19. The apparatus according to claim 18, wherein at least one of the first and second RF pulses other than the fifth and the sixth RF pulse is applied together with the gradient magnetic field pulse for slice selection.

20. The apparatus according to claim 17, wherein the gradient magnetic field for phase encoding is applied in at least one of an interval between the application of the fifth RF pulse and the detection of the first MR signal and interval between the application of the sixth RF pulse and the detection of the second MR signal.

21. The apparatus according to claim 20, wherein at least one of the RF pulses other than the fifth and the sixth RF pulse is applied together with a gradient magnetic field pulse for slice selection.

22. The apparatus according to claim 17, wherein an inversion RF pulse is applied to the first nuclide in at least one of before the first RF pulse, in an interval of the second RF pulse and the third RF pulse and in an interval between the fourth RF pulse and the fifth RF pulse.

23. The apparatus according to claim 22, wherein at least one of the first RF pulse and second RF pulses other than the fifth and the sixth RF pulses is applied together with a gradient magnetic field pulse for slice selection.

24. The apparatus according to claim 17, wherein at least one of the first and second RF pulses other than the fifth and the sixth RF pulses is applied together with a gradient magnetic field pulse for slice selection.

25. A magnetic resonance apparatus comprising:

first applying means for applying, to a first nuclide of a subject, an RF pulse corresponding to a resonance frequency of the first nuclide;

second applying means for applying, to a second nuclide magnetically coupled to the spins of the first nuclide, an RF pulse corresponding to a resonance frequency of the second nuclide;

gradient magnetic field applying means for applying a gradient magnetic field;

detecting means for detecting the MR signal from the spins of the first nuclide; and control means for controlling the first applying means, second applying means, gradient magnetic field applying means and detecting means in accordance with a predetermined pulse sequence, whereby in the predetermined pulse sequence first and second RF pulses are applied to the first nuclide, a third RF pulse is applied, simultaneously with or after the application of the second RF pulse, to the second nuclide magnetically coupled to the spins of the first nuclide, and a refocusing RF pulse to the first nuclide and inversion RF pulse to the second nuclide are applied in an interval between the first RF pulse and the second RF pulse, whereby there occurs a first polarization transfer from the spins of the first nuclide to the spins of the second nuclide;

after the first polarization transfer, a fourth RF pulse is applied to the second nuclide;

the RF pulse is applied to the first nuclide in an interval between the third RF pulse and the fourth RF pulse;

after the application of the fourth RF pulse, a fifth RF pulse is applied to the first nuclide together with at least one slice gradient magnetic field pulse, whereby the spins of the first nuclide in the first area are selectively excited, there occurs a second polarization transfer from the spins of the second nuclide to the spins of the first nuclide and those first MR signals are collected from the spins of the first nuclide in the first area experiencing first and second polarization transfers; and after the collection of the first MR signals, a sixth RF pulse is applied to the first nuclide together with at least one slice gradient magnetic field pulse, whereby the spins of the first nuclide in a second area are selectively excited, there occurs a third polarization transfer from the spins of the second nuclide to the spins of the first nuclide and those second MR signals are collected from those spins of the first nuclides in the second area experiencing the first and third polarization transfers.

26. The apparatus according to claim 25, wherein a gradient magnetic field for phase encoding is applied both in at least one of an interval between the first RF pulse and the second RF pulse and interval between the third RF pulse and the fourth RF pulse and in an interval in which the refocusing RF pulse and inversion RF pulse are not applied.

27. The apparatus according to claim 26, wherein at least one of the pulses other than the fifth and the sixth RF pulses is applied together with a gradient magnetic pulse for slice selection.

28. The apparatus according to claim 25, wherein a gradient magnetic field for phase encoding is applied in at least one of an interval between the application of the fifth RF pulse and the detection of the first MR signal and interval between the application of the sixth RF pulse and the detection of the second MR signal.

29. The apparatus according to claim 28, wherein at least one of the RF pulses other than the fifth and the sixth RF pulses is applied together with a gradient magnetic field pulse for slice.

30. The apparatus according to claim 25, wherein an inversion pulse is applied to the first nuclide in at least one of before the first RF pulse, in an interval between the second RF pulse and the third RF pulse and in an interval between the fourth RF pulse and the fifth RF pulse.

31. The apparatus according to claim 30, wherein at least one of the pulses other than the fifth and the sixth RF pulses is applied together with a gradient magnetic field pulse for slice selection.

32. The apparatus according to claim 25, wherein at least one of the pulses other than the fifth and the sixth RF pulses is applied together with a gradient magnetic field pulse for slice selection.

33. A magnetic resonance apparatus comprising:

first applying means for applying, to a first nuclide of a subject, an RF pulse corresponding to a resonance frequency of the first nuclide;

second applying means for applying, to a second nuclide, an RF pulse;

gradient magnetic field applying means for applying a gradient magnetic field to the subject;

detecting means for detecting the MR signal from the first nuclide; and control means for controlling the first applying means, second applying means, gradient magnetic field applying means and detecting means in accordance with a predetermined pulse sequence, whereby in the predetermined pulse sequence at least one of an RF pulse to the first nuclide and RF pulse to the second nuclide is applied to create a longitudinal spin order state of the first and second nuclides magnetically coupled to each other and, after this state, a first RF pulse to the first nuclide is applied simultaneously with at least one slice gradient magnetic field pulse, whereby the spins of the first nuclides in a first area are selectively excited and those first MR signals are collected from those spins of the first nuclides magnetically coupled to the spins of the second nuclide in the first area; and after the collection of the first MR signals, a second RF pulse to the first nuclide is applied simultaneously with at least one slice gradient magnetic field pulse, whereby those spins in the longitudinal spin order state of the first and second nuclides in the second area are excited and those second MR signals are collected from those spins of the first nuclides magnetically coupled to the spins of the second nuclides in the second area.

* * * * *